United States Patent
Inoue et al.

(10) Patent No.: US 8,289,723 B2
(45) Date of Patent: Oct. 16, 2012

(54) METHOD OF FABRICATING PACKAGED-DEVICE

(75) Inventors: Hiroaki Inoue, Kawasaki (JP); Takashi Katsuki, Kawasaki (JP); Fumihiko Nakazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 553 days.

(21) Appl. No.: 12/458,604

(22) Filed: Jul. 16, 2009

(65) Prior Publication Data

US 2010/0067208 A1 Mar. 18, 2010

(30) Foreign Application Priority Data

Sep. 18, 2008 (JP) ................................ 2008-239710

(51) Int. Cl.
- *H05K 7/02* (2006.01)
- *H05K 7/06* (2006.01)
- *H05K 7/08* (2006.01)
- *H05K 7/10* (2006.01)

(52) U.S. Cl. ........ 361/760; 361/764; 361/795; 361/803; 438/458; 438/464

(58) Field of Classification Search .......... 438/458–464; 29/850–854; 361/760–764, 803
See application file for complete search history.

(56) References Cited

U.S. PATENT DOCUMENTS

| 4,893,174 A * | 1/1990 | Yamada et al. ............... 257/621 |
| 6,391,673 B1 | 5/2002 | Ha et al. |
| 6,794,272 B2 * | 9/2004 | Turner et al. .................. 438/459 |
| 2008/0156095 A1 | 7/2008 | Tsuji et al. |
| 2009/0267165 A1 * | 10/2009 | Okudo et al. ................. 257/415 |

FOREIGN PATENT DOCUMENTS

| JP | 2001-196484 | 7/2001 |
| JP | 2005-129888 | 5/2005 |
| JP | 2005-251898 | 9/2005 |

* cited by examiner

*Primary Examiner* — Tuan T Dinh
(74) *Attorney, Agent, or Firm* — Staas & Halsey LLP

(57) ABSTRACT

A method includes forming grooves in first regions included in a first wafer to form wiring regions defined by the grooves; forming insulating portions in the grooves; joining a surface of the first wafer on which the wiring regions are formed to a first surface of a device wafer including device forming regions after forming the insulating portions; forming through holes in the wiring regions of the first wafer after joining the first wafer to the device wafer, the holes extending through the first wafer; filling the holes with a conductive material; joining a second wafer to a second surface of the device wafer opposite the first surface, the second wafer including second regions; exposing the wiring regions by thinning the first wafer after joining the first wafer to the device wafer; and cutting the device wafer, the first wafer, and the second wafer after thinning the first wafer.

9 Claims, 21 Drawing Sheets

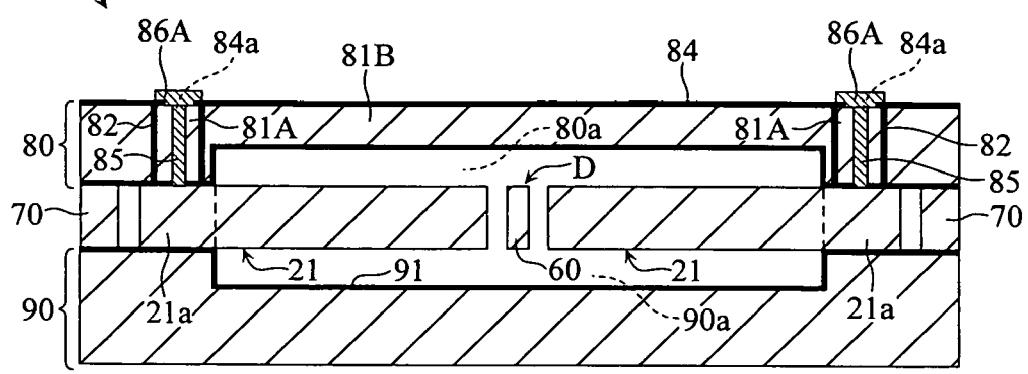
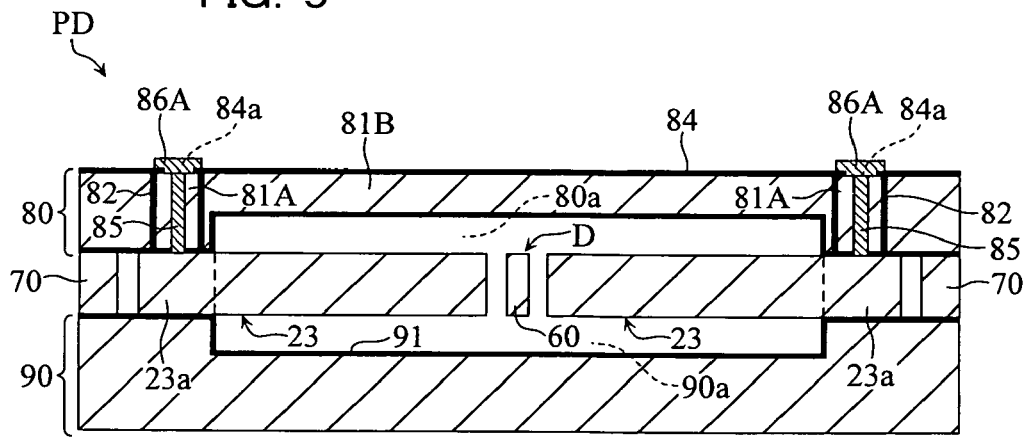

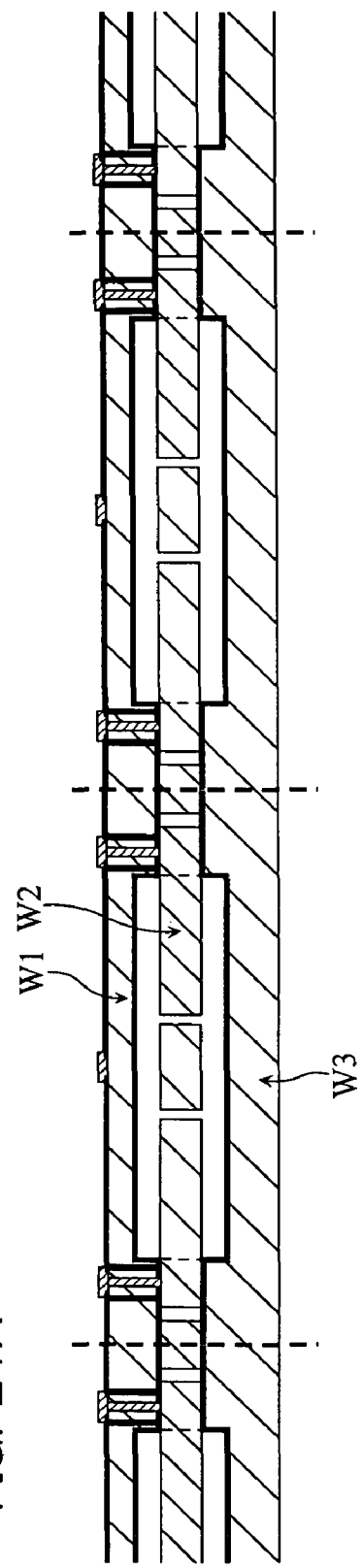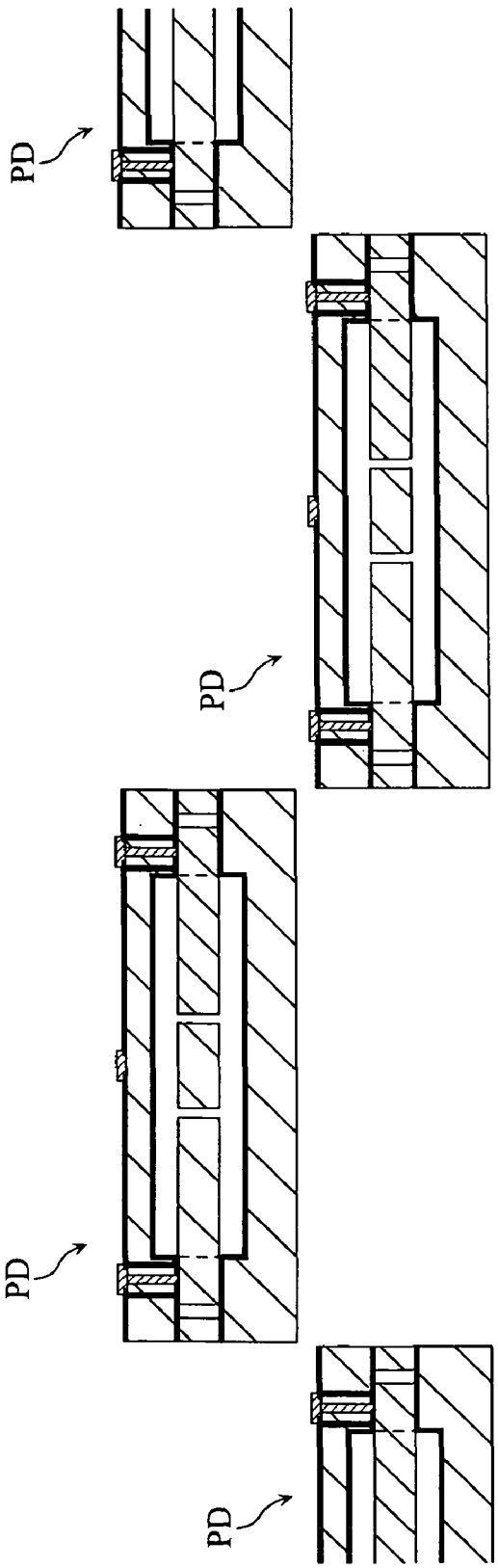

METHOD OF FABRICATING PACKAGED-DEVICE

CROSS-REFERENCE TO RELATED APPLICATION

This application is based upon and claims the benefit of priority of the prior Japanese Patent Application No. 2008-239710, filed on Sep. 18, 2008, the entire contents of which are incorporated herein by reference.

FIELD

The embodiments discussed herein are related to a packaged device, such as an angular velocity sensor or an acceleration sensor, including a movable part, and to a method of fabricating the packaged device.

BACKGROUND

In recent years, devices formed by micromachining to have microstructures have been applied to various technical fields. Such devices include sensing devices having minute movable parts (e.g., angular velocity sensors and acceleration sensors). Such sensing devices are used in image stabilizing functions of video cameras and camera-equipped mobile telephones, car navigation systems, air-bag deploying timing systems, and attitude control systems for cars and robots, and the like.

A sensing device having a microstructure has, for example, a movable part, a fixed part, a connecting section for connecting the movable part and the fixed part, a pair of driving electrodes for driving the movable part, a pair of detection electrodes for detecting the operation and displacement of the movable part, and a plurality of terminal portions for external connection. In such a sensing device, adhesion of foreign substances and dust to the electrodes and damage to the electrodes adversely affect operating performance. For this reason, packaging is sometimes performed on the wafer level. Japanese Unexamined Patent Application Publication Nos. 2001-196484, 2005-129888, and 2005-251898 disclose techniques relating to packaging.

SUMMARY

According to an aspect of an embodiment, a method of fabricating a packaged-device includes forming grooves in a plurality of first-packaging-member forming regions included in a first packaging wafer to form a plurality of wiring regions defined by the grooves; forming insulating portions in the grooves; joining a surface of the first packaging wafer on which the wiring regions are formed to a first surface of a device wafer including a plurality of device forming regions after forming the insulating portions in the grooves; forming through holes in the wiring regions of the first packaging wafer after joining the first packaging wafer to the device wafer, the through holes extending through the first packaging wafer; filling the through holes with a conductive material; joining a second packaging wafer to a second surface of the device wafer opposite the first surface, the second packaging wafer including a plurality of second-packaging-member forming regions; exposing the wiring regions by thinning the first packaging wafer after joining the first packaging wafer to the device wafer; and forming a plurality of laminated structure bodies including the first-packaging-member forming regions, the device forming regions, and the second-packaging-member forming regions by cutting the device wafer, the first packaging wafer, and the second packaging wafer after thinning the first packaging wafer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a cross-sectional view taken along line VIII-VIII in FIG. 1;

FIG. 9 is a cross-sectional view taken along line IX-IX in FIG. 1;

FIGS. 21A and 21B illustrate fabrication processing for the packaged device subsequent to the processing illustrated in FIGS. 20A to 20C;

DESCRIPTION OF EMBODIMENTS

Figure 1:
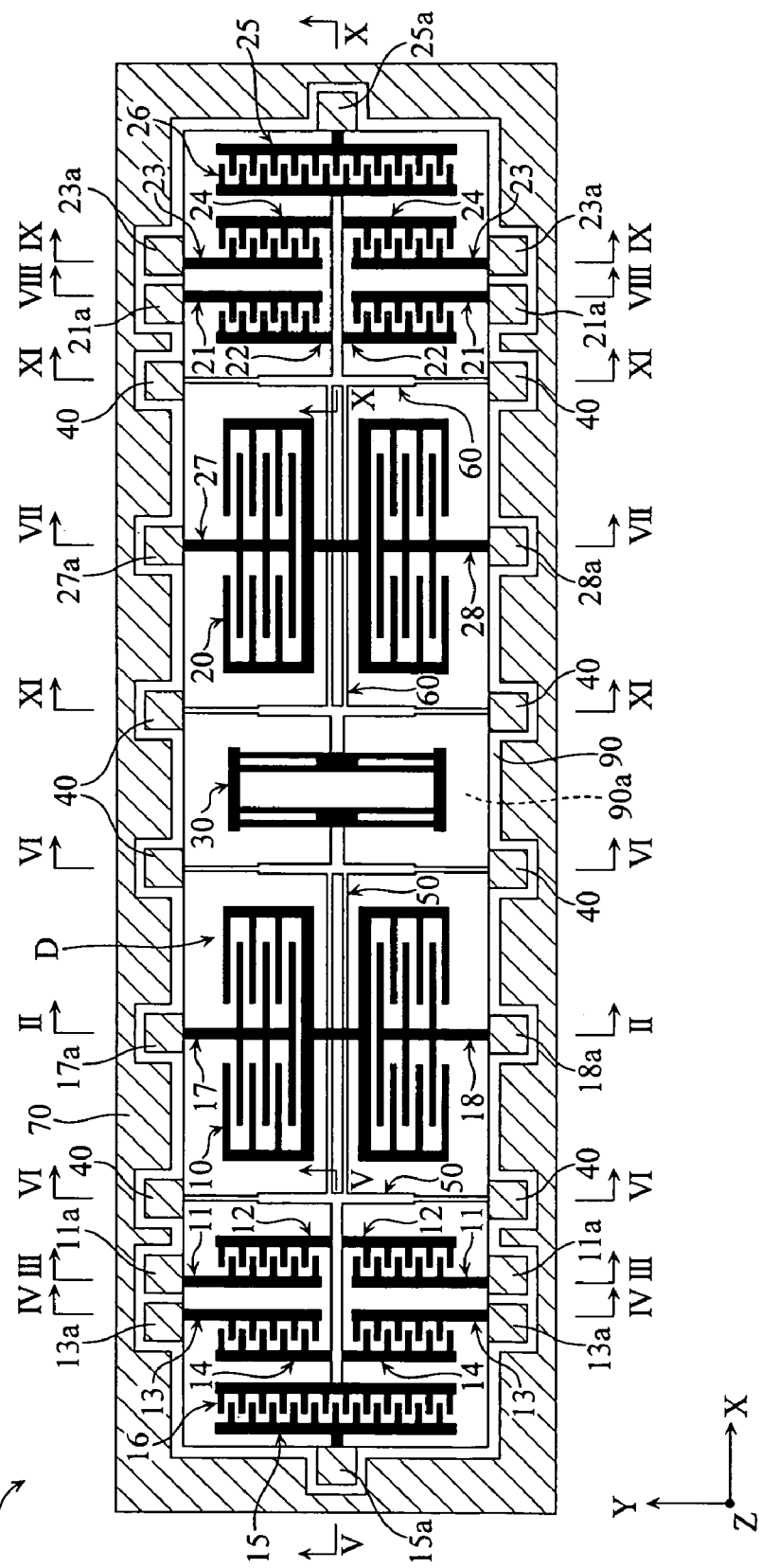
FIG. 1 is a partial plan view of a packaged device according to an embodiment.

FIGS. 1 to 11 illustrate a packaged device PD as an example of a packaged movable microdevice according to an embodiment. FIG. 1 is a partial plan view of the packaged device PD. FIGS. 2, 3, 4, 5, 6, 7, 8, 9, 10, and 11 are cross-sectional views taken along lines II-II, III-III, IV-IV, V-V, VI-VI, VII-VII, VIII-VIII, IX-IX, X-X, and XI-XI in FIG. 1, respectively.

The packaged device PD includes a sensing device D, an outer wall portion 70, a packaging member 80 (not illustrated in FIG. 1), and a packaging member 90.

As illustrated in FIG. 1, the sensing device D includes vibrating portions 10 and 20, driving electrodes 11, 12, 13, 14, 21, 22, 23, and 24, monitor electrodes 15, 16, 25, and 26, detection electrodes 17, 18, 27, and 28, a coupling beam 30, anchor portions 40, and connecting portions 50 and 60. In this embodiment, the sensing device D is used as an angular velocity sensor. The outer wall portion 70 surrounds the sensing device D. Further, the outer wall portion 70 is provided between the packaging members 80 and 90, as illustrated in FIGS. 2 to 11. A device layer section (sensing device D, outer wall portion 70) is formed by machining a silicon wafer by a bulk machining technique such as a MEMS (micro-electromechanical systems) technique. The silicon wafer is given conductivity by being doped with impurities. In FIG. 1, portions of the device layer section joined to the packaging members 80 and 90 are depicted with diagonal hatching. Further, portions of the device layer section that are different from the connecting portions 50 and 60 and that are spaced apart from the packaging members 80 and 90 are depicted as black.

The vibrating portion 10 has a comb-shaped electrode structure including a plurality of electrode teeth. The vibrating portion 10 vibrates in the X-axis and Y-axis directions. The vibrating portion 20 also has a comb-shaped electrode structure including a plurality of electrode teeth. The vibrating portion 20 vibrates in the X-axis and Y-axis directions. The vibrating portions 10 and 20 are spaced apart from each other in the X-axis direction. The X-axis direction and the Y-axis direction are orthogonal to each other.

Figure 3:
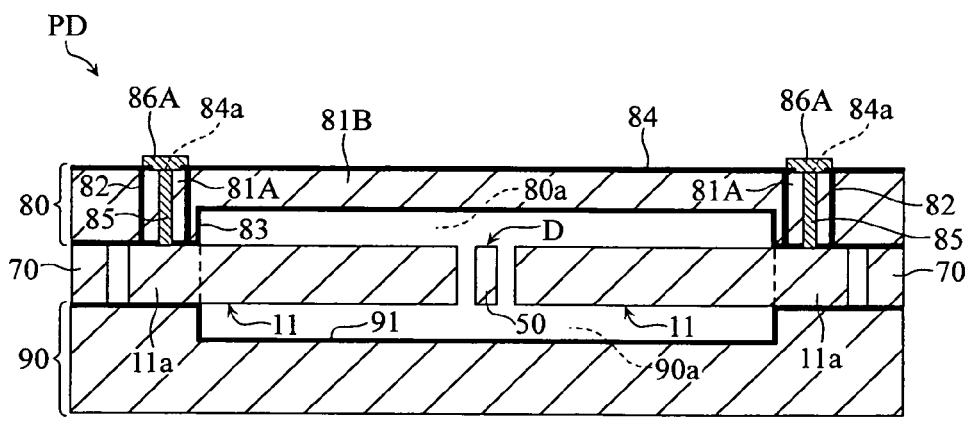
FIG. 3 is a cross-sectional view taken along line III-III in FIG. 1.

Each of the driving electrodes 11 is a fixed driving electrode, and includes an anchor portion 11a and a comb-shaped electrode structure portion extending from the anchor portion 11a. The comb-shaped electrode structure portion includes a plurality of electrode teeth. As illustrated in FIG. 3, the anchor portion 11a is fixed between the packaging members 80 and 90. Each of the driving electrodes 12 is a movable driving electrode, and includes a comb-shaped electrode structure portion that extends from the connecting portion 50 and includes a plurality of electrode teeth. The driving electrodes 11 and 12 generate driving force (electrostatic attractive force) for causing reference vibration of the vibrating portion 10 in the X-axis direction.

Figure 4:
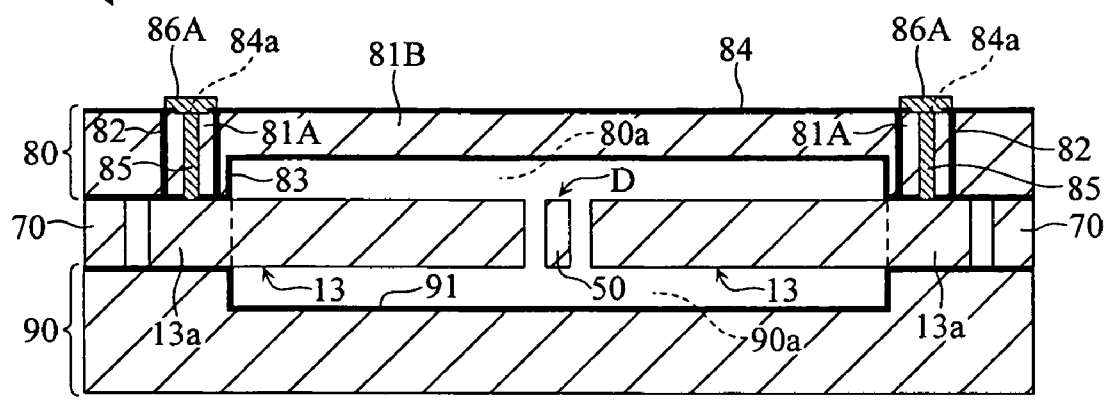
FIG. 4 is a cross-sectional view taken along line IV-IV in FIG. 1.

Each of the driving electrodes 13 is a fixed driving electrode, and includes an anchor portion 13a and a comb-shaped electrode structure portion extending from the anchor portion 13a. The comb-shaped electrode structure portion includes a plurality of electrode teeth. As illustrated in FIG. 4, the anchor portion 13a is fixed between the packaging members 80 and 90. Each of the driving electrodes 14 is a movable driving electrode, and includes a comb-shaped electrode structure portion that extends from the connecting portion 50 and includes a plurality of electrode teeth. The driving electrodes 13 and 14 generate driving force (electrostatic attractive force) for causing reference vibration of the vibrating portion 10 in the X-axis direction.

Figure 5:
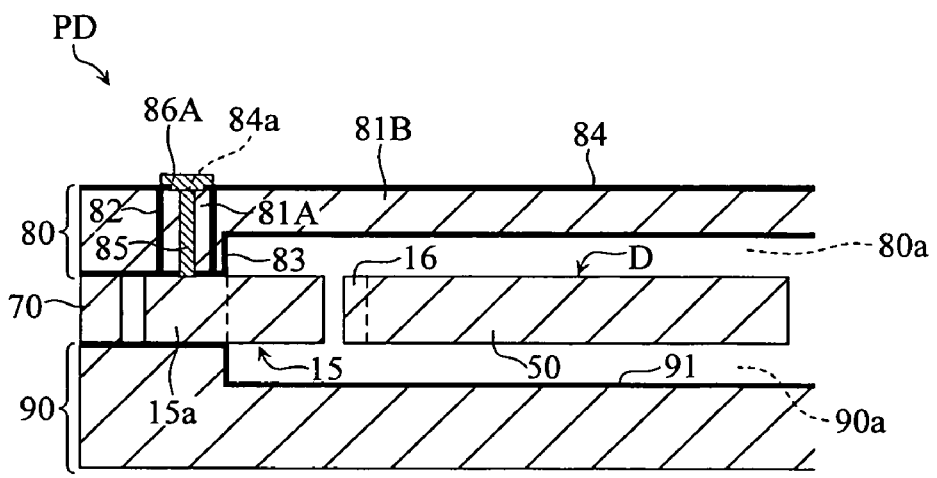
FIG. 5 is a cross-sectional view taken along line V-V in FIG. 1.

The monitor electrode 15 is a fixed monitor electrode, and includes an anchor portion 15a and a comb-shaped electrode structure portion extending from the anchor portion 15a. The comb-shaped electrode structure portion includes a plurality of electrode teeth. As illustrated in FIG. 5, the anchor portion 15a is fixed between the packaging members 80 and 90. The monitor electrode 16 is a movable monitor electrode, and has a comb-shaped electrode structure portion that extends from the connecting portion 50 and includes a plurality of electrode teeth. The monitor electrodes 15 and 16 are used to detect the displacement amount of the vibrating portion 10 in the X-axis direction based on a change in electrostatic capacitance.

Figure 2:
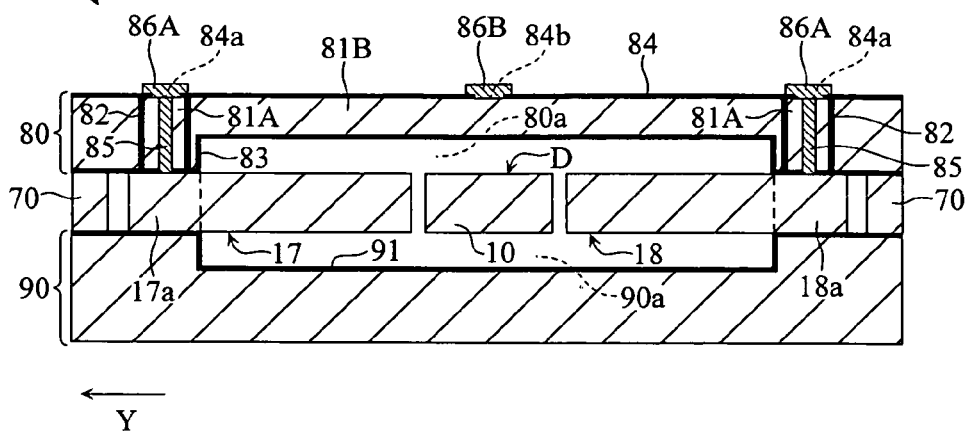
FIG. 2 is a cross-sectional view taken along line II-II in FIG. 1.

The detection electrode 17 includes an anchor portion 17a and a comb-shaped electrode structure portion extending from the anchor portion 17a. The comb-shaped electrode structure portion includes a plurality of electrode teeth. As illustrated in FIG. 2, the anchor portion 17a is fixed between the packaging members 80 and 90. The detection electrode 18 includes an anchor portion 18a and a comb-shaped electrode structure portion extending from the anchor portion 18a. The comb-shaped electrode structure portion includes a plurality of electrode teeth. The anchor portion 18a is fixed between the packaging members 80 and 90. The detection electrodes 17 and 18 are used to detect the displacement amount of the vibrating portion 10 in the Y-axis direction based on a change in electrostatic capacitance between the detection electrodes 17 and 18 and the comb-shaped electrode structure portion of the vibrating portion 10.

Each driving electrode 21 is a fixed driving electrode, and includes an anchor portion 21a and a comb-shaped electrode structure portion extending from the anchor portion 21a. The comb-shaped electrode structure portion includes a plurality of electrode teeth. As illustrated in FIG. 8, the anchor portion 21a is fixed between the packaging members 80 and 90. Each driving electrode 22 is a movable driving electrode, and includes a comb-shaped electrode structure portion that extends from the connecting portion 60 and includes a plurality of electrode teeth. The driving electrodes 21 and 22 generate driving force for causing reference vibration of the vibrating portion 20 in the X-axis direction.

Each driving electrode 23 is a fixed driving electrode, and includes an anchor portion 23a and a comb-shaped electrode structure portion extending from the anchor portion 23a. The comb-shaped electrode structure portion includes a plurality of electrode teeth. As illustrated in FIG. 9, the anchor portion 23a is fixed between the packaging members 80 and 90. Each driving electrode 24 is a movable driving electrode, and includes a comb-shaped electrode structure portion that extends from the connecting portion 60 and includes a plurality of electrode teeth. The driving electrodes 23 and 24 generate driving force for causing reference vibration of the vibrating portion 20 in the X-axis direction.

Figure 10:
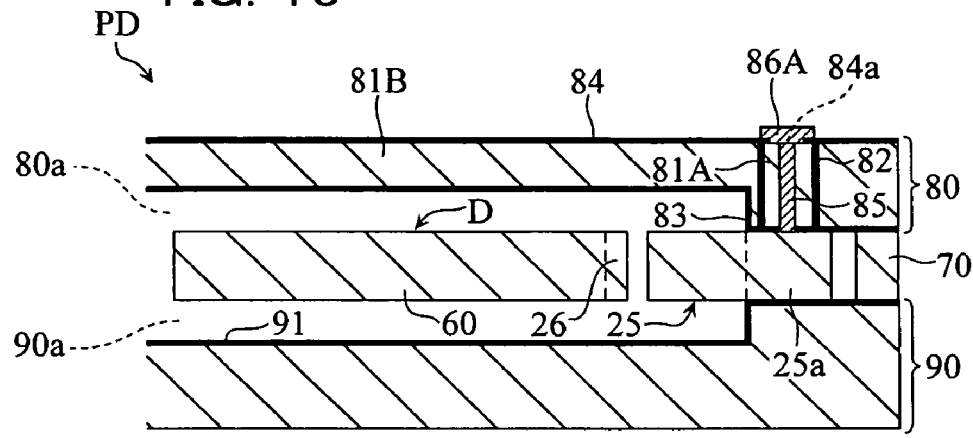
FIG. 10 is a cross-sectional view taken along line X-X in FIG. 1.

The monitor electrode 25 is a fixed monitor electrode, and includes an anchor portion 25a and a comb-shaped electrode structure portion extending from the anchor portion 25a. The comb-shaped electrode structure portion includes a plurality of electrode teeth. As illustrated in FIG. 10, the anchor portion 25a is fixed between the packaging members 80 and 90. The monitor electrode 26 is a movable monitor electrode, and includes a comb-shaped electrode structure portion that extends from the connecting portion 60 and includes a plurality of electrode teeth. The monitor electrodes 25 and 26 are used to detect the displacement amount of the vibrating portion 20 in the X-axis direction.

Figure 7:
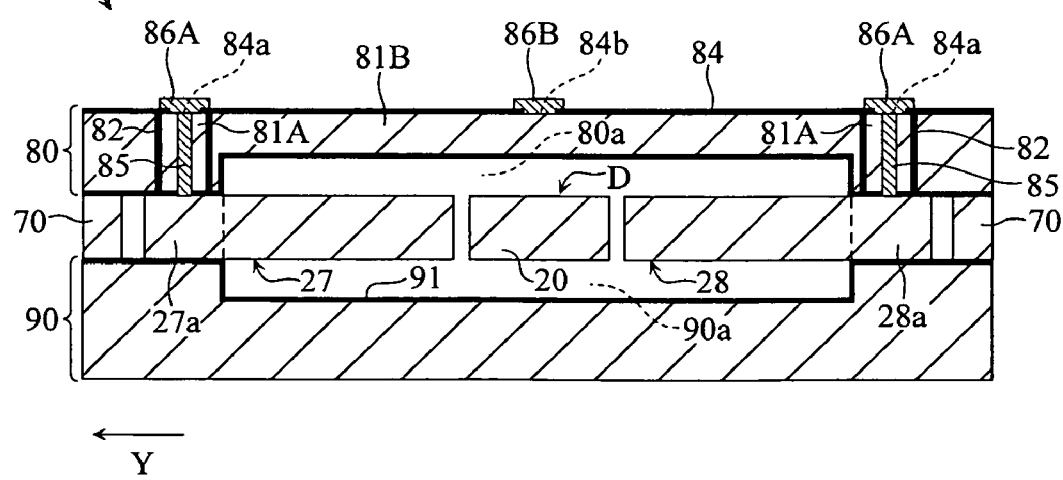
FIG. 7 is a cross-sectional view taken along line VII-VII in FIG. 1.

The detection electrode 27 includes an anchor portion 27a and a comb-shaped electrode structure portion extending from the anchor portion 27a. The comb-shaped electrode structure portion includes a plurality of electrode teeth. As illustrated in FIG. 7, the anchor portion 27a is fixed between the packaging members 80 and 90. The detection electrode 28 includes an anchor portion 28a and a comb-shaped electrode structure portion extending from the anchor portion 28a. The comb-shaped electrode structure portion includes a plurality of electrode teeth. The anchor portion 28a is fixed between the packaging members 80 and 90. The detection electrodes 27 and 28 are used to detect the displacement amount of the vibrating portion 20 in the Y-axis direction based on a change in electrostatic capacitance between the detection electrodes 27 and 28 and the comb-shaped electrode structure portion of the vibrating portion 20.

The coupling beam 30 serves to couple reference vibrations in the X-axis direction of the vibrating portions 10 and 20 so that the vibrations have opposite phases.

Figure 6:
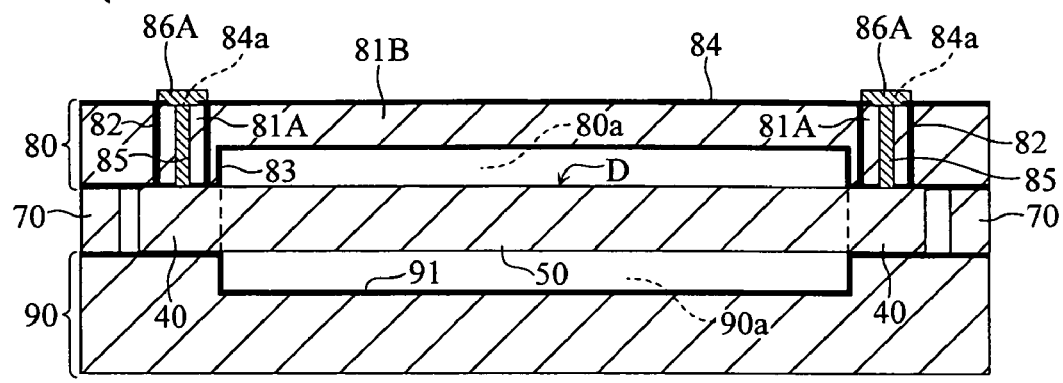
FIG. 6 is a cross-sectional view taken along line VII-VII in FIG. 1.
Figure 11:
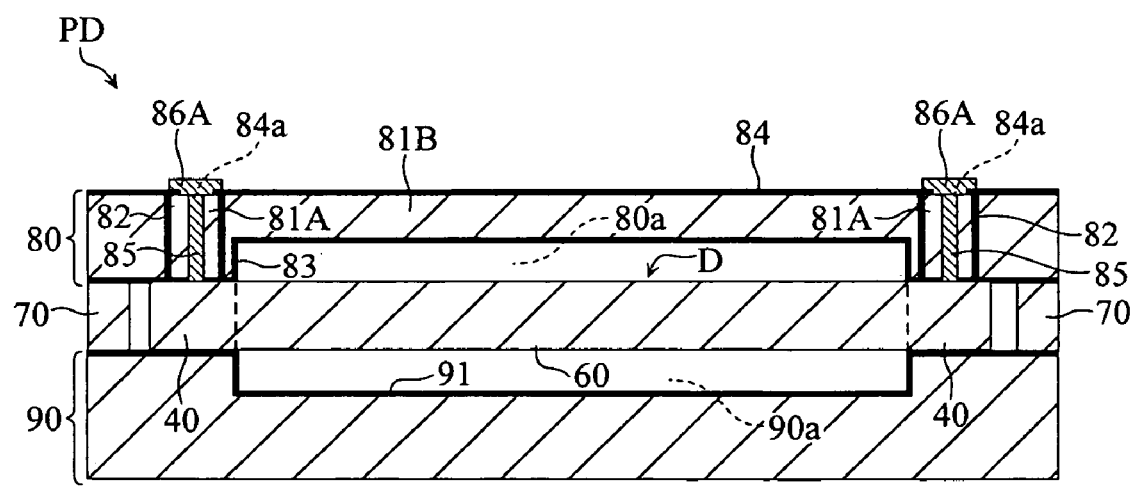
FIG. 11 is a cross-sectional view taken along line XI-XI in FIG. 1.

The anchor portions 40 are fixed between the packaging members 80 and 90 as illustrated for example in FIGS. 6 and 11.

The connecting portion 50 connects the vibrating portion 10, the driving electrodes 12 and 14, the monitor electrode 16, the coupling beam 30, and the anchor portions 40. This allows the connecting portion 50 to transmit driving forces generated by the driving electrodes 11 to 14 to the vibrating portion 10 and the coupling beam 30 while supporting the vibrating portion 10.

The connecting portion 60 connects the vibrating portion 20, the driving electrodes 22 and 24, the monitor electrode 26, the coupling beam 30, and the anchor portions 40. This allows the connecting portion 60 to transmit driving forces generated by the driving electrodes 21 to 24 to the vibrating portion 20 and the coupling beam 30 while supporting the vibrating portion 20.

The vibrating portions 10 and 20, the driving electrodes 12, 14, 22, and 24, the monitor electrodes 16 and 26, the coupling beam 30, and the connecting portions 50 and 60 described above make up a movable part in the sensing device D. The driving electrodes 11, 13, 21, and 23, the monitor electrodes 15 and 25, the detection electrodes 17, 18, 27, and 28, and the anchor portions 40 described above make up a fixed part in the sensing device D. The above-described anchor portions 11a, 13a, 15a, 17a, 18a, 21a, 23a, 25a, 27a, 28a, and 40 serve as terminals for external connection in the sensing device D.

Referring to FIGS. 2 to 11, the packaging member 80 is joined to the anchor portions 11a, 13a, 15a, 17a, 18a, 21a, 23a, 25a, 27a, 28a, and 40 in the sensing device D, and the outer wall portion 70. The packaging member 80 has a recess 80a at a position corresponding to the movable part of the sensing device D. The packaging member 80 also includes wiring regions 81A, non-wiring regions 81B, insulating films 82, 83, and 84, conductive plugs 85, and electrode pads 86A and 86B. This packaging member 80 is formed by machining a silicon wafer by a bulk micromachining technique such as a MEMS technique. The silicon wafer is given conductivity by being doped with impurities.

In the packaging member 80, the wiring regions 81A are provided at positions corresponding to the anchor portions 11a, 13a, 15a, 17a, 18a, 21a, 23a, 25a, 27a, 28a, and 40. In this embodiment, the wiring regions 81A are shaped like cylinders. The insulating films 82 surround the wiring regions 81A so as to insulate and separate the wiring regions 81A from the non-wiring regions 81B. The insulating film 83 is provided between the wiring regions 81A and the non-wiring regions 81B, and between the sensing device D and the outer wall portion 70. The insulating film 84 is provided on the opposite side to the insulating film 83 in the packaging member 80. The insulating film 84 has openings 84a at positions corresponding to the wiring regions 81A, and openings 84b at positions corresponding to the non-wiring regions 81B. The conductive plugs 85 extend through the wiring regions 81A and the insulating film 83 in the thickness direction of the packaging member 80. Conductive plugs 85 are joined to one of the anchor portions 11a, 13a, 15a, 17a, 18a, 21a, 23a, 25a, 27a, 28a, and 40 in the sensing device A. The electrode pads 86A are provided at the openings 84a of the insulating film 84, and are joined to the wiring regions 81A and the conductive plugs 85. Each electrode pad 86A is electrically connected via the wiring region 81A and the conductive plug 85 to one of the anchor portions 11a, 13a, 15a, 17a, 18a, 21a, 23a, 25a, 27a, 28a, and 40 in the sensing device D. The electrode pads 86B are provided at the openings 84b of the insulating film 84, and are joined to the non-wiring regions 81B. The electrode pads 86A and 86B function as terminals for external connection in the packaged device PD.

As illustrated FIGS. 2 to 11, the packaging member 90 is joined to the anchor portions 11a, 13a, 15a, 17a, 18a, 21a, 23a, 25a, 27a, 28a, and 40 in the sensing device D and the outer wall portion 70. The packaging member 90 has a recess 90a at a position corresponding to the movable part of the sensing device D. The packaging member 90 also has an insulating film 91 on the side to be joined to the sensing device D. This packaging member 90 is formed by machining a silicon wafer by a bulk micromachining technique such as a MEMS technique.

The sensing device D is enclosed by the packaging members 80 and 90 and the outer wall portion 70. The interior of the packaged device PD is typically sealed in a vacuum. However, for example, nitrogen gas may be sealed in the packaged device PD.

The packaged device PD having the above-described configuration may be electrically connected to an external circuit. The terminals (electrode pads 86A and 86B) provided in the packaging member 80 may be electrically connected to specific terminals in the external circuit by wire bonding.

Figure 12:
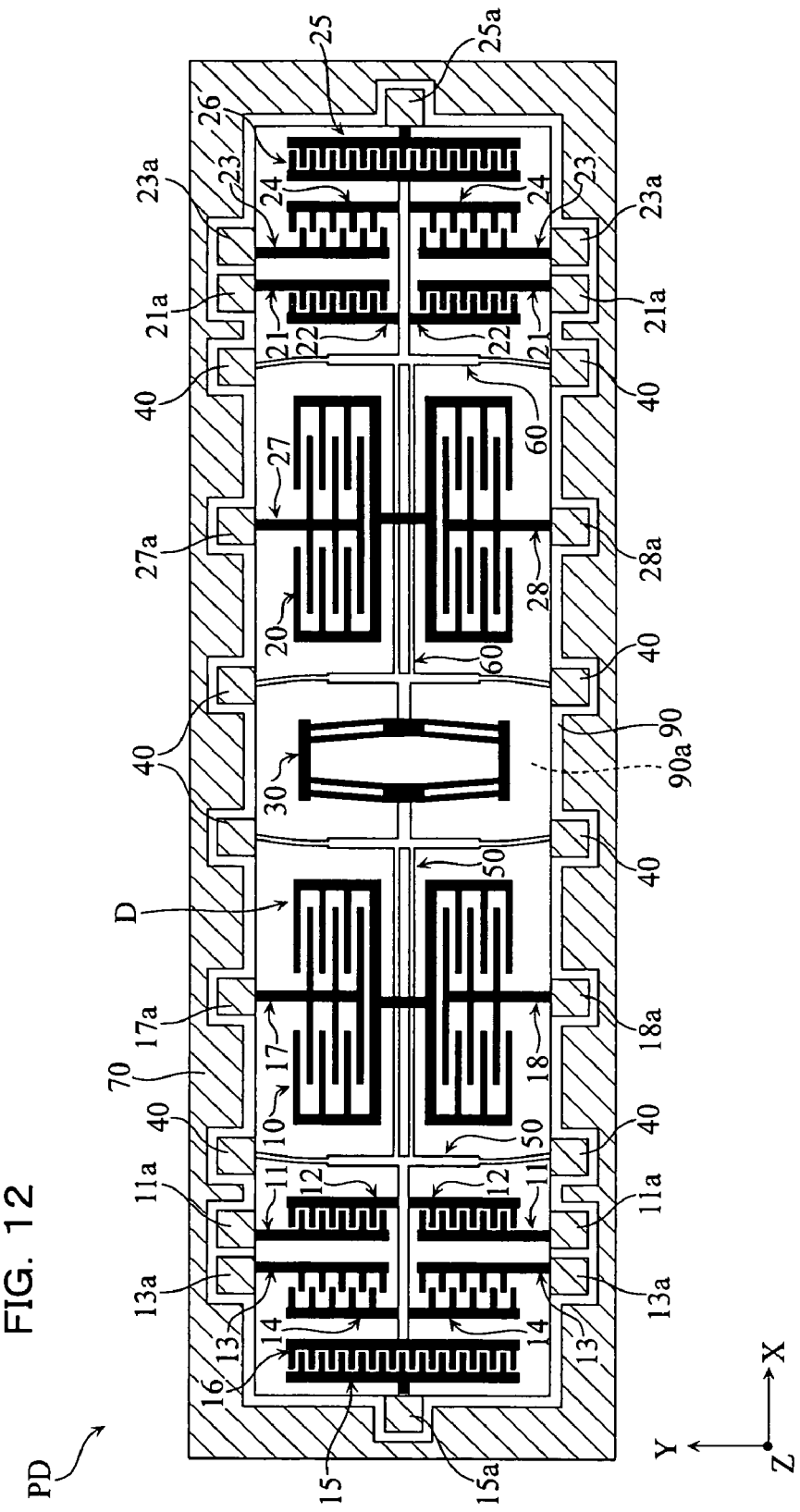
FIG. 12 is a partial plan view of the packaged device of the embodiment during driving.
Figure 13:
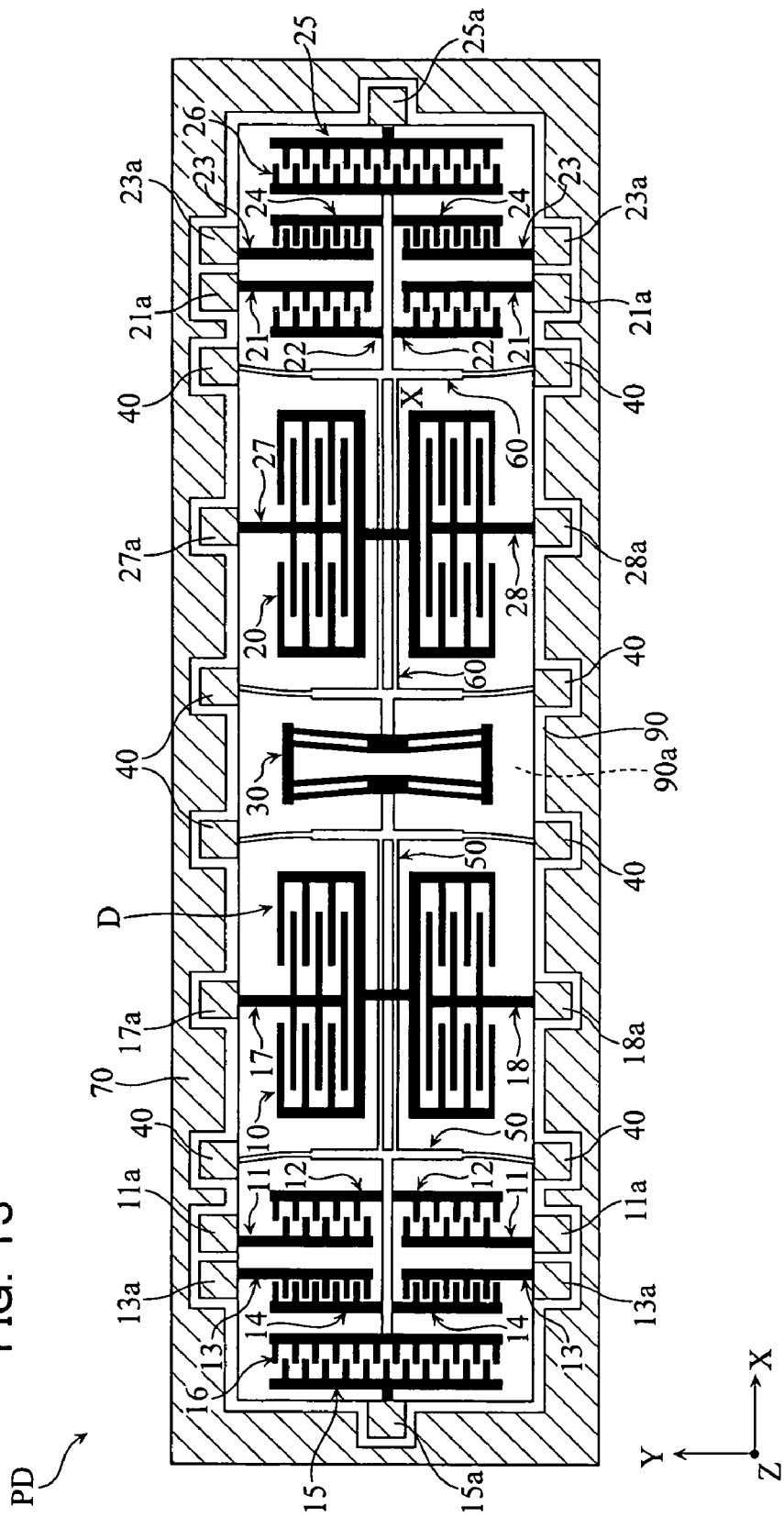
FIG. 13 is a partial plan view of the packaged device of the embodiment during driving.

When the packaged device PD or the sensing device D is driven, the vibrating portions 10 and 20 are caused to produce reference vibrations with opposite phases in the X-axis direction, as illustrated in FIGS. 12 and 13. That is, for example, a constant bias voltage is applied to the vibrating portions 10 and 20 and the driving electrodes 12, 14, 22, and 24. While applying a sinusoidal voltage (driving voltage) to the driving electrodes 11 and 23 in this state, a sinusoidal voltage having a phase opposite the above-described voltage (phase difference is 180 degrees) is applied to the driving electrodes 13 and 21. This generates reference vibrations. The bias voltage is applied to the vibrating portions 10 and 20 and the driving electrodes 12, 14, 22, and 24 via the electrode pads 86A electrically connected to the anchor portions 40, the anchor portions 40, and the connecting portions 50 and 60. The driving voltages are applied to the driving electrodes 11, 13, 21, and 23 via the electrode pads 86A electrically connected to the anchor portions 11a, 13a, 21a, and 23a, and the anchor portions 11a, 13a, 21a, and 23a.

As described above, the coupling beam 30 serves to couple reference vibrations of the vibrating portions 10 and 20 in the X-axis direction so that the vibrations have opposite phases. If the coupling beam 30 is not provided, it is difficult to precisely generate reference vibrations of the vibrating portions 10 and 20 with opposite phases during driving. This is because the natural resonance frequencies of the vibrating portions 10 and 20 are, in actuality, different due to the influence of, for example, production errors of the components of the movable part including the vibrating portions 10 and 20. Since the coupling beam 30 mechanically couples the vibrating portions 10 and 20 via the connecting portions 50 and 60, reference vibrations of the vibrating portions 10 and 20 are mechanically correlated. This allows the phase difference between reference vibrations of the vibrating portions 10 and 20 during driving to approach an ideal value.

When the packaged device PD or the sensing device D is driven, the monitor electrodes 15, 16, 25, and 26 work so that resonance of the movable part is maintained in a vibration mode in which the vibrating portions 10 and 20 produce reference vibrations with opposite phases. First, the displacement amount of the vibrating portion 10 in the X-axis direction is detected from the change in electrostatic capacitance between the monitor electrodes 15 and 16 in a circuit (not illustrated). The detection result is fed back to the driving voltage to be applied to the driving electrodes 11 and 13, so that the phase and amplitude of the driving voltage (sinusoidal voltage) are adjusted finely. Further, the displacement amount of the vibrating portion 20 in the X-axis direction is detected from the change in electrostatic capacitance between the monitor electrodes 25 and 26. Then, the detection result is fed back to the driving voltage to be applied to the driving electrodes 21 and 23, so that the phase and amplitude of the driving voltage (sinusoidal voltage) are adjusted finely.

Figure 14:
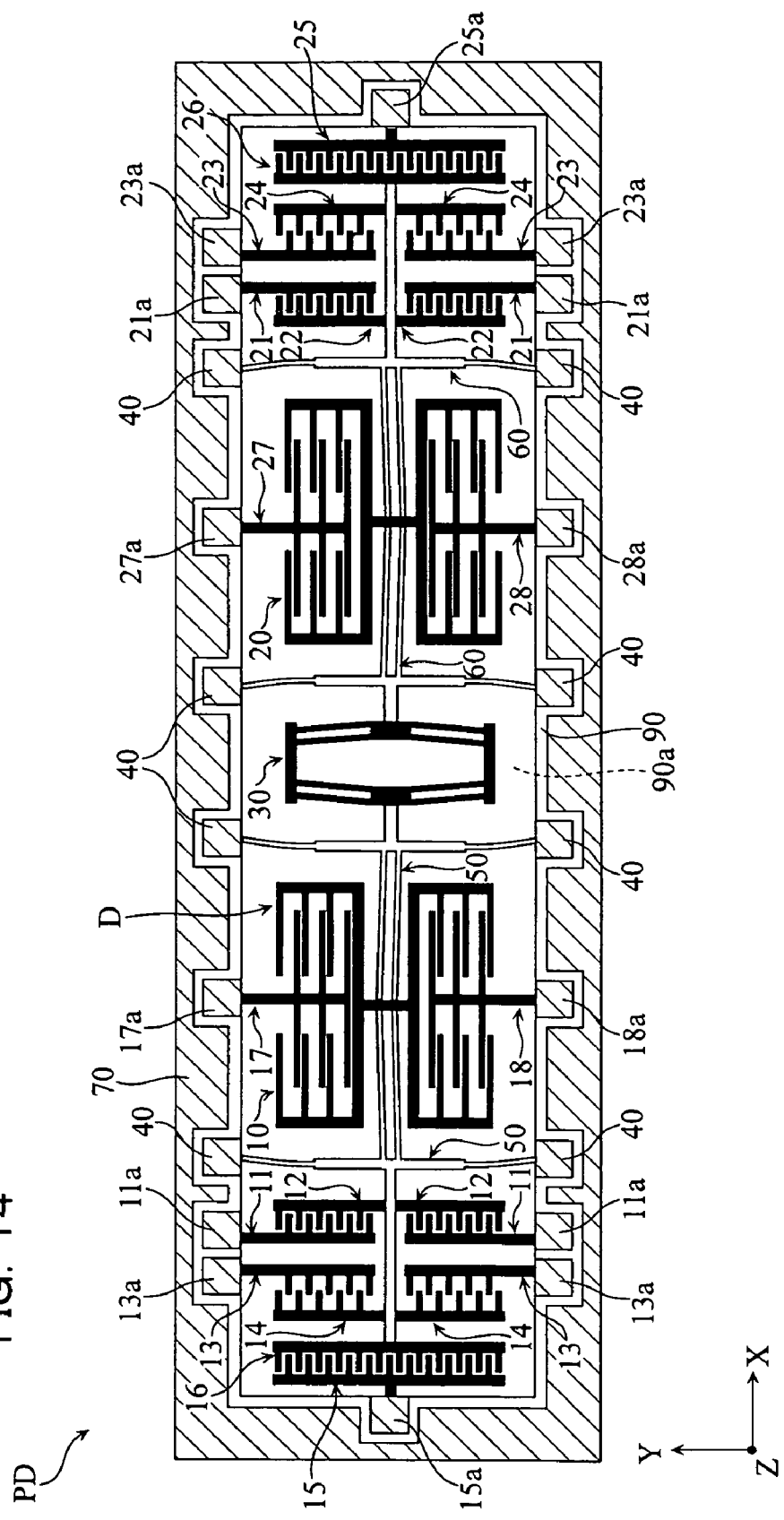
FIG. 14 is a plan view of the packaged device of the embodiment on which an angular velocity acts during driving.

In a state in which the vibrating portions 10 and 20 are producing reference vibrations with opposite phases, as described above, for example, when an angular velocity around the Z-axis (orthogonal to the X- and Y-axes) illustrated in FIG. 12 acts on the sensing device D or the vibrating portions 10 and 20, a Coriolis force for displacing the vibrating portions 10 and 20 in the Y-axis direction is generated periodically. Consequently, the vibrating portions 10 and 20 produce vibrations with opposite phases (Coriolis vibrations) in the Y-axis direction, for example, as illustrated in FIG. 14, and the electrostatic capacitance between the vibrating portion 10 and the detection electrodes 17 and 18 and the electrostatic capacitance between the vibrating portion 20 and the detection electrodes 27 and 28 change. Based on the changes in electrostatic capacitance, the displacement amounts or vibration amplitudes of the vibrating portions 10 and 20 are detected. Then, based on the detection result, the angular velocity acting on the sensing device D or the vibrating portions 10 and 20 is calculated in the not-illustrated circuit. In this embodiment, the packaged device PD functions as an angular velocity sensor, as described above.

Referring to FIGS. 2 and 7, the packaged device PD includes contact pads 86B electrically connected to the non-wiring regions 81B of the packaging member 80. In this way, the non-wiring regions 81B are grounded via the electrode pads 86B. By grounding the non-wiring regions 81B, the potential of the non-wiring regions 81B is kept constant during the above-described driving operation. Thus, it is possible to prevent signals from leaking from one wiring region 81A to the other wiring region 81A via the non-wiring region 81B.

Figure 15A:
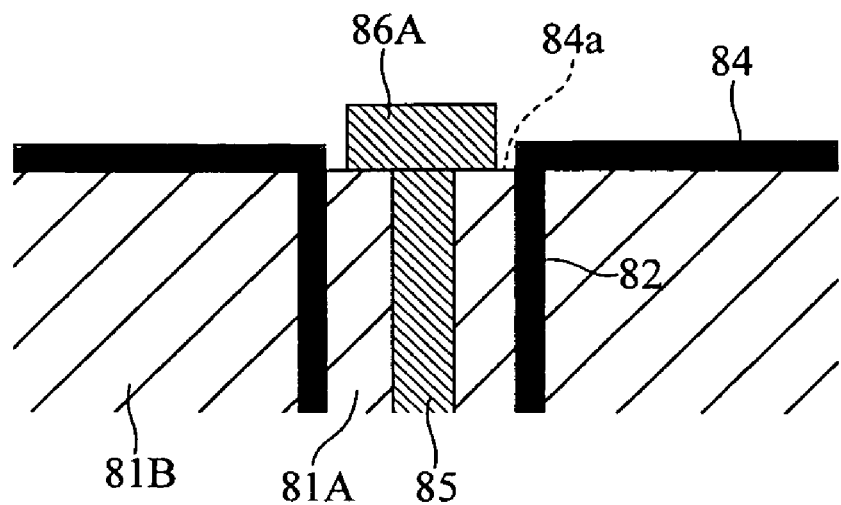
FIGS. 15A and 15B are partial cross-sectional views of a modification of the packaged device illustrated in FIG. 1.

The electrode pads 86A of the packaged device PD may be provided inside the openings 84*a* of the insulating film 84 in the in-plane direction of the packaging member 80, as illustrated in FIG. 15A. In this configuration, the area in which the electrode pads 86A are directly connected to the wiring regions 81A (formed of a silicon material), e.g., not via the insulating film 84, is large. Thus, it is possible to increase the adhesiveness of the electrode pads 86A to the surface of the packaging member 80.

Figure 15B:
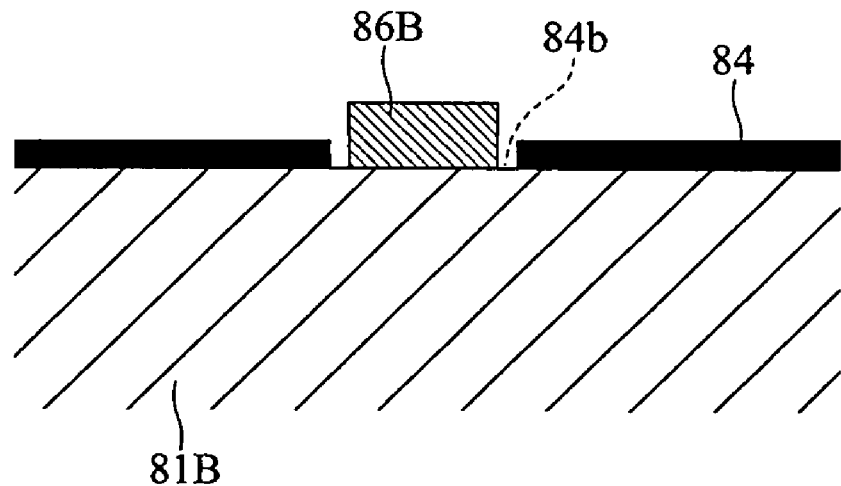

The electrode pads 86*b* of the packaged device PD may be provided inside the openings 84*b* of the insulating film 84 in the in-plane direction of the packaging member 80, as described in FIG. 15B. In this configuration, the area in which the electrode pads 86B are directly connected to the non-wiring regions 81B (formed of a silicon material), e.g., not via the insulating film 84, is large. Thus, it is possible to increase the adhesiveness of the electrode pads 86B to the surface of the packaging member 80.

FIGS. 16 to 21 illustrate a method of fabricating a packaged device PD by bulk micromachining. FIGS. 16 to 21 illustrate changes in the cross section, which corresponds to FIG. 2, included in an area where a single packaged device PD is formed. FIGS. 21A and 21B illustrate a partial cross section of a plurality of device forming regions.

Figure 16A:
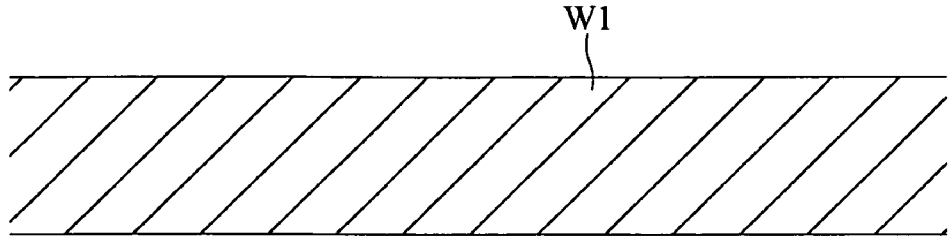
FIGS. 16A to 16D illustrate a fabrication procedure for the packaged device illustrated in FIG. 1.

In this method, a packaging wafer W1 is first prepared, as illustrated in FIG. 16A. The packaging wafer W1 includes a plurality of sections for forming the above-described packaging member 80. The packaging wafer W1 is formed by a silicon wafer, and is given conductivity by being doped with impurities. As impurities, for example, p-type impurities, such as B, or n-type impurities, such as P and Sb, are adopted. The packaging wafer W1 has a thickness of, for example, 200 to 500 μm.

Figure 16B:
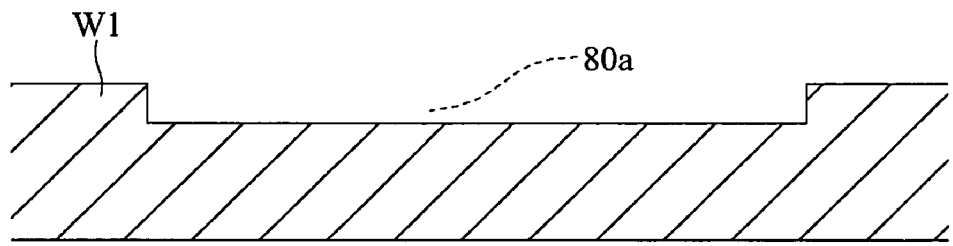

As illustrated in FIG. 16B, the above-described recesses 80*a* are formed in the packaging wafer W1. For example, the packaging wafer W1 may be etched by DRIE (deep reactive ion etching) using, as a mask, a resist pattern having openings corresponding to the recesses 80*a*. The etching depth may be, for example, 30 μm. In DRIE, for example, a Bosch process is preferably adopted. The Bosch process allows good anisotropic etching. In the Bosch process, etching using a SF6 gas and sidewall protection using a C4F8 gas are repeated alternately. In a later DRIE step, a Bosch process may also be adopted.

Figure 16C:
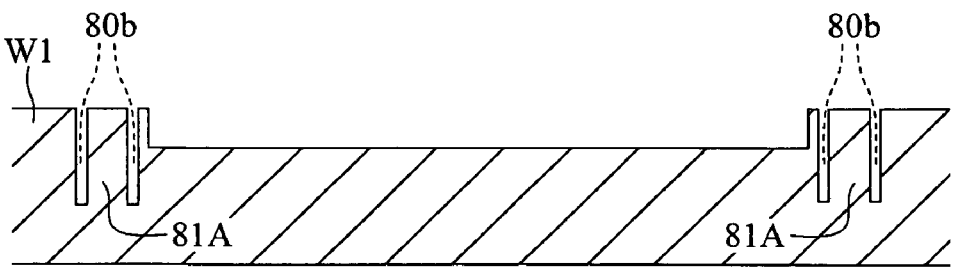

As illustrated in FIG. 16C, the above-described wiring regions 81A are formed by forming separation grooves 80*b* in the packaging wafer W1. For example, the packaging wafer W1 is etched by DRIE using, as a mask, a resist pattern having openings corresponding to the separation grooves 80*b*. The etching depth may be, for example, 50 to 150 μm. The separation grooves 80*b* are where the above-described insulating films 82 are provided, and surround the wiring regions 81A.

Figure 16D:
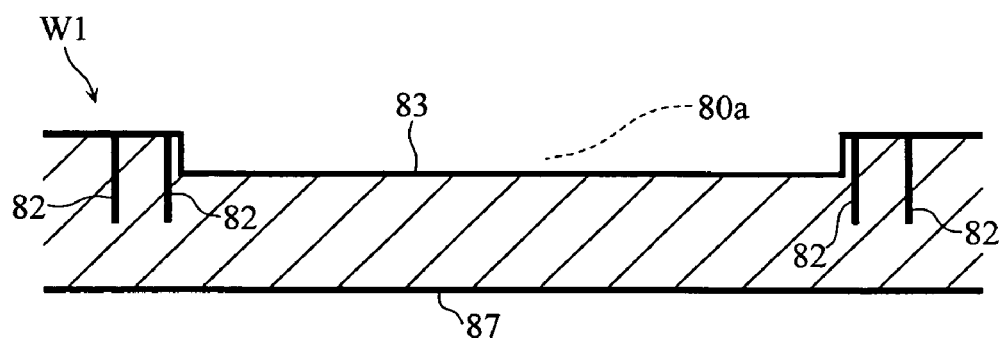

As illustrated in FIG. 16D, the above-described insulating films 82 are formed in the separation grooves 80*b*. Also, the above-described insulating films 83 and 87 are formed. For example, the insulating films 82, 83, and 87 may be formed by thermally oxidizing the surfaces of the packaging wafer W1.

Figure 17A:
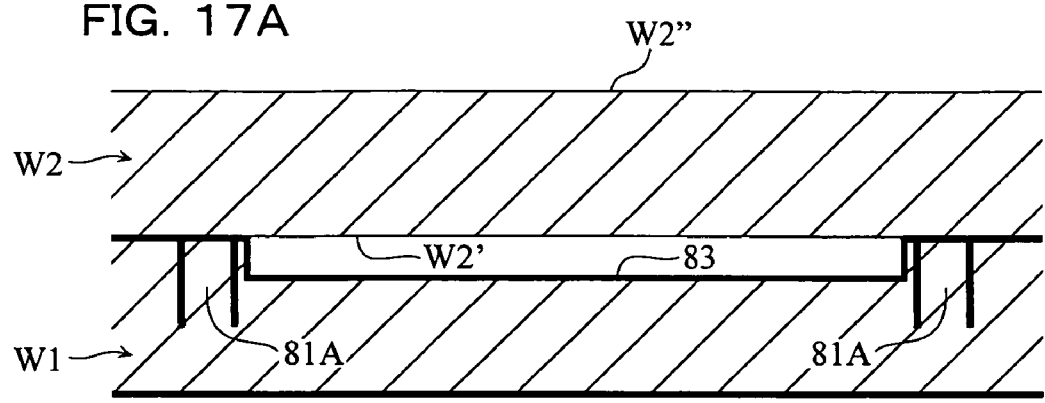
FIGS. 17A to 17C illustrate fabrication processing for the packaged device subsequent to the processing illustrated in FIGS. 16A to 16D.

As illustrated in FIG. 17A, the packaging wafer W1 is joined to a device wafer W2. The device wafer W2 includes a plurality of device forming regions for forming the above-described sensing device D. The device wafer W2 is a silicon wafer having a first surface W2' and a second surface W2", and is given conductivity by being doped with impurities. As impurities, for example, p-type impurities, such as B, or n-type impurities, such as P and Sb, are adopted. In this process, the side of the packaging wafer W1 where the wiring regions 81A are provided is joined to the first surface W2' of the device wafer W2. Room-temperature bonding, for example, may be adopted as a joining method. In room-temperature bonding, surfaces of members to be joined are cleaned by removing impurities by etching with an Ar beam under a high vacuum (e.g., dangling bonds of constituent atoms are exposed), and the members are joined together in this state. Direct bonding or plasma activation bonding may also be adopted as joining methods.

Figure 17B:
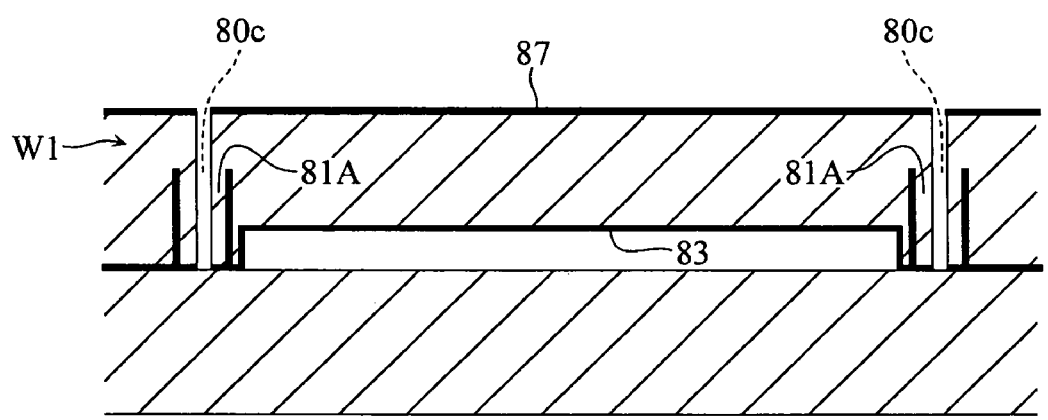

As illustrated in FIG. 17B, through holes 80c are formed in the packaging wafer W1. To form the through holes 80c, for example, openings are first formed in the insulating film 87 by etching the insulating film 87 using a resist pattern as a mask. As an etching method, wet etching may be adopted. When wet etching is adopted, for example, buffered hydrogen fluoride (BHD) containing hydrofluoric acid and ammonium fluoride may be used as an etchant. When etching the insulating film, wet etching may also be adopted. Subsequently, a base material of the packaging wafer W1 is etched using the resist pattern and the insulating film 87 as masks. This etching is performed until the insulating film 83 is exposed. For example, DRIE may be adopted as an etching method. Exposed portions of the insulating film 83 are removed by etching. In this way, the through holes 80c may formed so as to extend through the packaging wafer W1 via the wiring regions 81A.

Figure 17C:
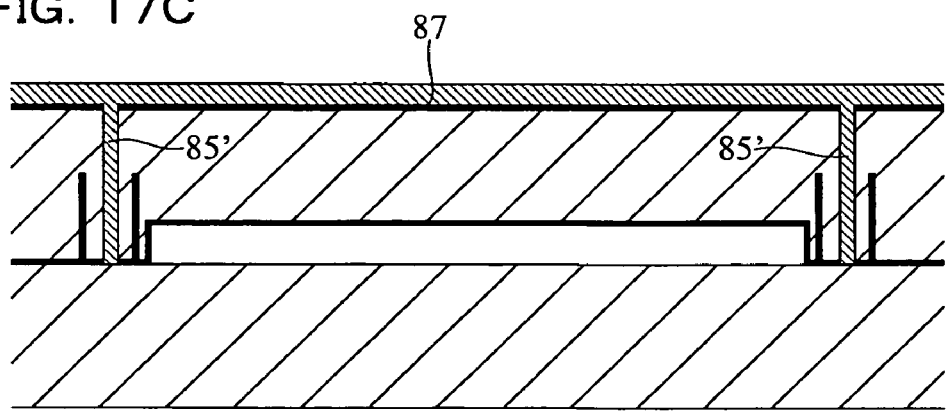

As illustrated in FIG. 17C, the through holes 80c are filled with a conductive material 85' by, for example, LP-CPD or metalorganic chemical vapor deposition (MOCVD). The conductive material 85' may be, for example, polysilicon, and may also be deposited on the insulating film 87.

Figure 18A:
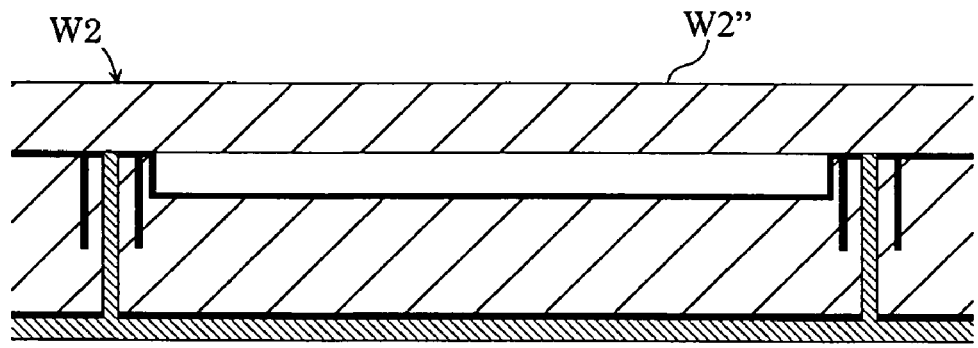
FIGS. 18A to 18C illustrate fabrication processing for the packaged device subsequent to the processing illustrated in FIGS. 17A to 17C.

As illustrated in FIG. 18A, the device wafer W2 is thinned. The device wafer W2 may be thinned by being polished from the second surface W2". As a polishing method, for example, chemical mechanical polishing (CMP) may be adopted. In this embodiment, the thickness of the device wafer W2 is reduced to, for example, 20 to 100 μm.

Figure 18B:
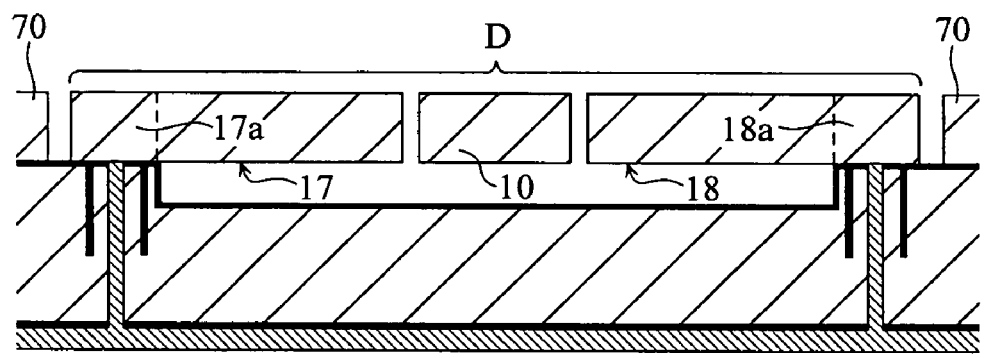

As illustrated in FIG. 18B, sections of the above-described sensing devices D (including vibrating portions 10 and 20, driving electrodes 11 to 14 and 21 to 24, monitor electrodes 15, 16, 25, and 26, detection electrodes 17, 18, 27, and 28, coupling beam 30, anchor portions 40, and connecting portions 50 and 60) and outer wall portions 70 are formed. For example, the device wafer W2 is etched by DRIE using, as a mask, a resist pattern having a pattern shape corresponding to the sections of the sensing devices D and the outer wall portions 70.

Figure 18C:
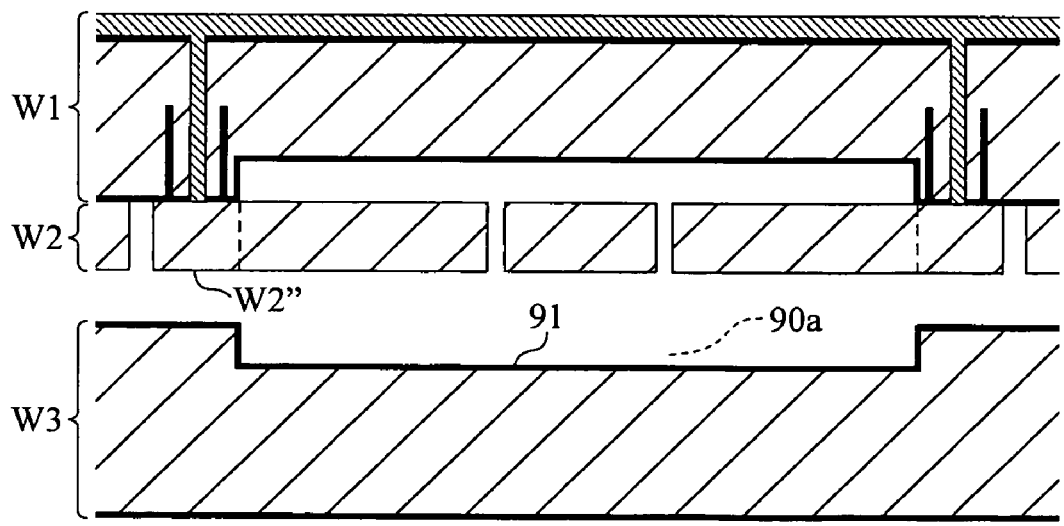
Figure 19A:
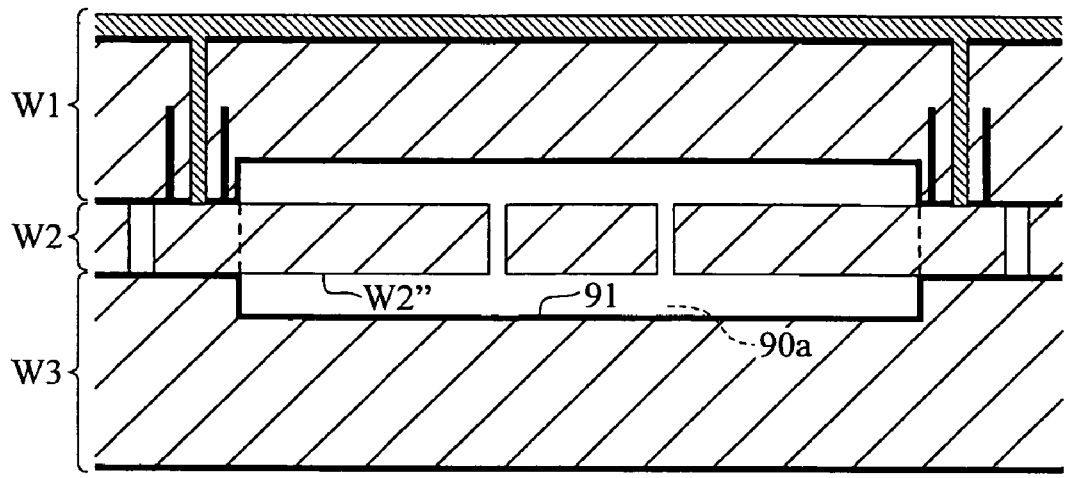
FIGS. 19A to 19C illustrate fabrication processing for the packaged device subsequent to the processing illustrated in FIGS. 18A to 18C.

As illustrated in FIGS. 18C and 19A, the second surface W2" of the device wafer W2 is joined to a packaging wafer W3. The packaging wafer W3 includes a plurality of packaging-member forming regions for forming the above-described packaging member 90. The packaging wafer W3 includes the above-described recess 90a in each of the packaging-member forming regions. The above-described insulating film 91 is provided on a surface of the packaging wafer W3. For example, the recess 90a may be formed by etching a silicon wafer using a resist pattern as a mask. The etching depth may be, for example, 30 μm. As an etching method, for example, DRIE may be adopted. The insulating film 91 may be formed on the surface of the silicon wafer by thermal oxidization. The packaging wafer W3 has a thickness of, for example, 200 to 300 μm. As a joining method, room-temperature bonding, direct bonding, or plasma activation bonding may be adopted. In this way, packaging on the wafer level is achieved.

Figure 19B:
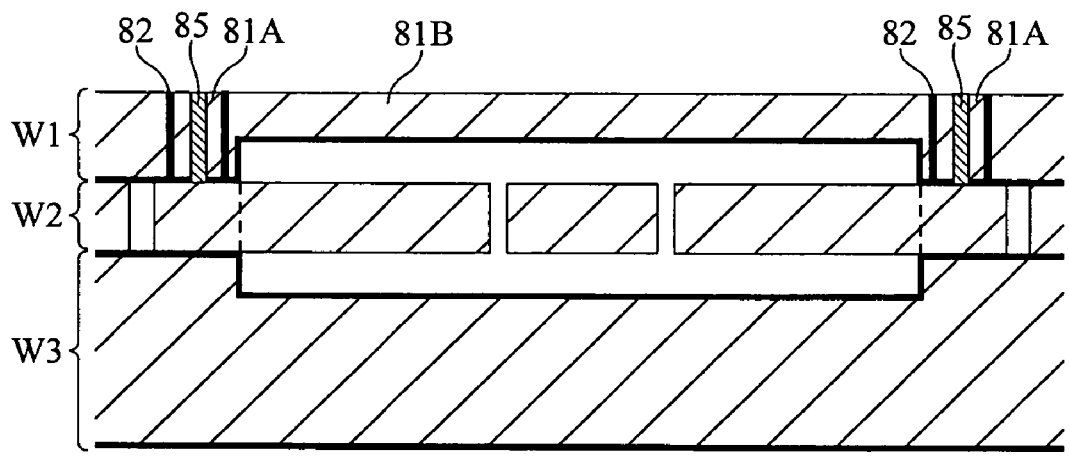

As illustrated in FIG. 19B, the packaging wafer W1 is thinned by, for example, CMP or DRIE. The wiring regions 81A of the packaging wafer W1 are insulated and separated from the non-wiring regions 81B by the insulating films 82, and the above-described conductive plugs 85 extending through the wiring regions 81A are formed. The thickness of the packaging wafer W1 is reduced to, for example, 50 to 150 μm.

Figure 19C:
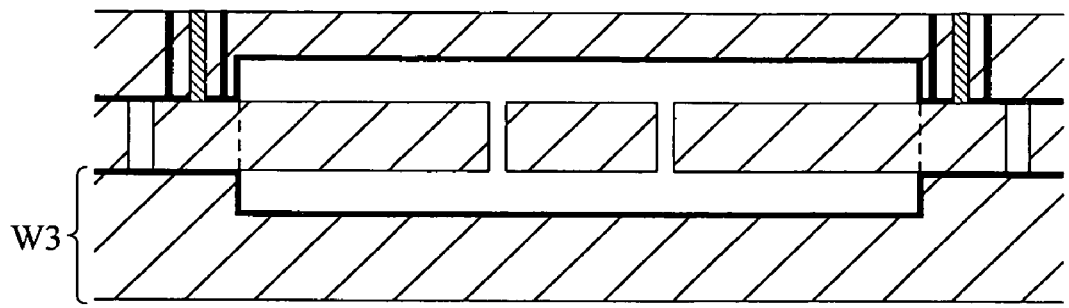

As illustrated in FIG. 19C, the packaging wafer W3 is thinned by, for example, CMP or DRIE. The thickness of the packaging wafer W3 may be reduced to, for example, 50 to 200 μm.

Figure 20A:
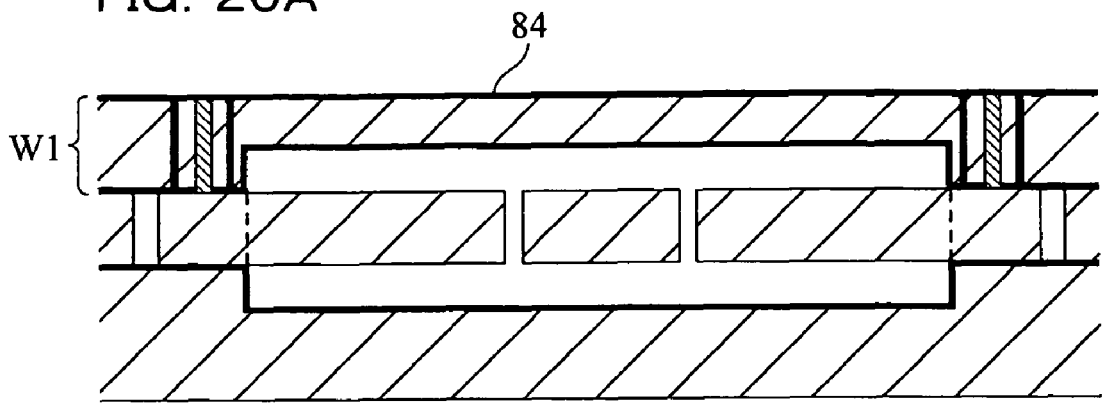
FIGS. 20A to 20C illustrate fabrication processing for the packaged device subsequent to the processing illustrated in FIGS. 19A to 19C.

As illustrated in FIG. 20A, an insulating film 84 is formed. The insulating film 84 is formed by, for example, forming a film of an insulating material on the packaging wafer W1 by sputtering or plasma CVD. As the insulating material, $SiO_2$ may be adopted.

Figure 20B:
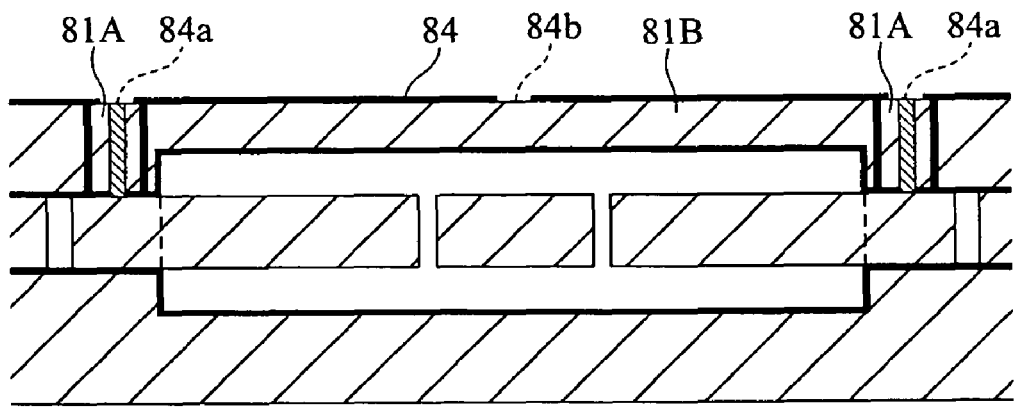

As illustrated in FIG. 20B, openings 84a and 84b are formed in the insulating film 84. For example, the openings 84a and 84b are formed by etching the insulating film 84 using a resist pattern as a mask. The wiring regions 81A are exposed from the openings 84a, and the non-wiring region 81B is exposed from the opening 84b.

Figure 20C:
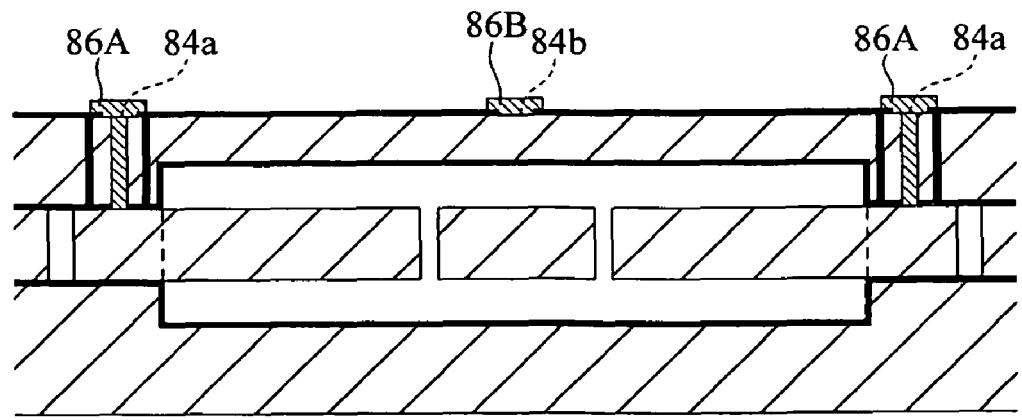

As illustrated in FIG. 20C, electrode pads 86A and 86B are formed. To form the electrode pads 86A and 86B, for example, a metal material film is first formed on the insulating film 84 by sputtering so as to close the openings 84a and 84b. Subsequently, the metal material film is etched using a resist pattern as a mask. Thus, the electrode pads 86A and 86B are patterned.

As illustrated in FIGS. 21A and 21B, a laminated structure body including the device wafer W2 and the packaging wafers W1 and W3 is cut into pieces. Through the above-described procedures, the packaged device PD according to the embodiment is fabricated.

This embodiment allows packaging on the wafer level. Therefore, it is possible to prevent operation performance of the movable part from being reduced by dust adhesion or damage to the elements of the sensing device D serving as the movable microdevice.

In this method, the packaging wafer W1 includes a plurality of regions in each of which the packaging member 80 in the packaged device PD is formed. As illustrated in FIG. 17A, when the packaging wafer W1 is joined to the device wafer W2, the thickness of the packaging wafer W1 is larger than the thickness of the packaging member 80 in the packaged device PD. After being joined to the device wafer W2, the packaging wafer W1 is thinned, as illustrated in FIG. 19B. In this case, since the packaging wafer W1 is joined to the device wafer W2, the packaging wafer W1 is not easily damaged. The packaging member 80 is derived from the packaging wafer W1 thinned in this way. Thus, since this method allows the packaging member 80 to be easily thinned, this method is suited for thinning of the packaged device PD or the package.

As illustrated in FIG. 17A, when the packaging wafer W1 is joined to the device wafer W2, the packaging wafer W1 does not have through holes. For this reason, the packaging wafer W1 is less likely to be broken than when a packaging wafer having through holes is used.

In addition, according to this method, it is easy to reduce the number of procedures. In this method, the conductive plugs 85 are provided such as to extend through the wiring regions 81A of the packaging member 80. That is, the wiring regions 81A are present around the conductive plugs 85. For this reason, there is no need to form diffusion preventing layers, which prevent diffusion of metal from the conductive plugs 85, around the conductive plugs 85. Moreover, in this method, there is no need to form a seed layer for electric plating when forming the conductive plugs 85. Therefore, this method reduces the number of procedures.

As described above, this method is suited for thinning the obtained package, ensuring the strength of the packaging wafer W1 before the packaging wafer W1 is joined to the device wafer W2, and reducing the number of procedures.

Joining of the device wafer W2 and the packaging wafer W3 illustrated in FIGS. 18C and 19A may be performed before joining of the packaging wafer W1 and the device wafer W2 illustrated in FIG. 17A. In this case, processing of the device wafer W2 illustrated in FIGS. 18A and 18B is performed between joining the device wafer W2 and the packaging wafer W3 and joining the packaging wafer W1 and the device wafer W2.

FIGS. 22 to 26 illustrate another fabricating method for a packaged device PD using bulk micromachining. FIGS. 22 to 25 illustrate changes in a cross section included in a section where a single packaged device PD is formed, and corresponds to FIG. 2. FIG. 26 illustrates a partial cross section of a plurality of device forming sections.

Figure 22A:
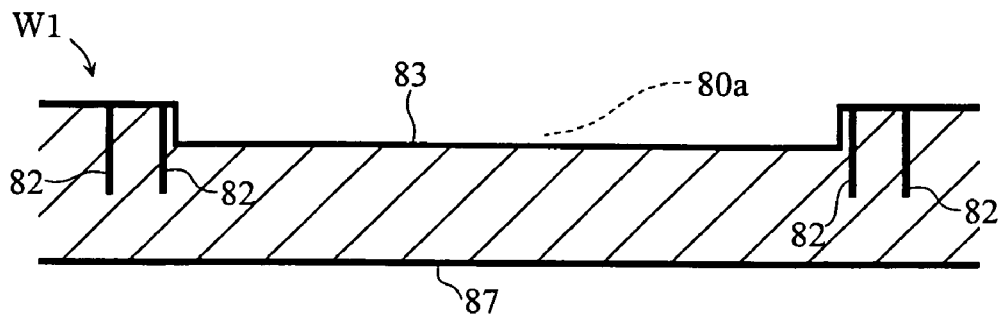
FIGS. 22A to 22D illustrate another fabrication procedure for the packaged device illustrated in FIG. 1.

In this method, a packaging wafer W1 illustrated in FIG. 16A is processed as illustrated in FIGS. 16B to 16D, so that the packaging wafer W1 is brought into the state illustrated in FIG. 22A.

Figure 22B:
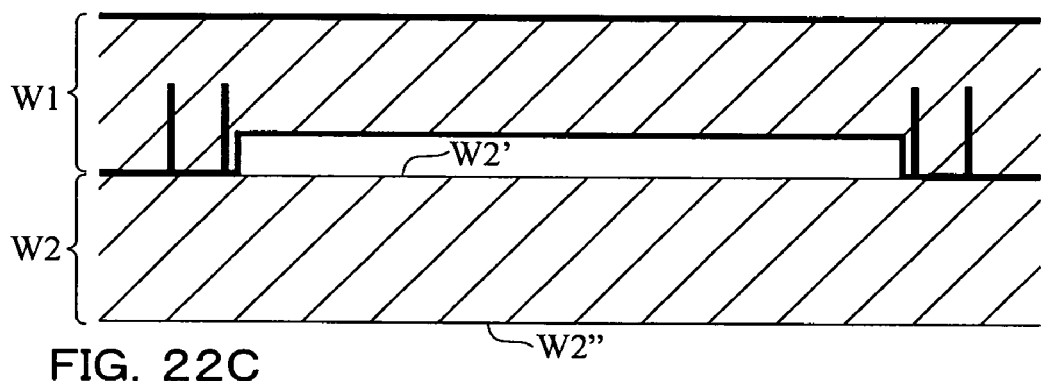

As illustrated in FIG. 22B, the packaging wafer W1 is joined to a device wafer W2. The device wafer W2 is similar to the above-described device wafer. In this step, room-temperature bonding, direct bonding, or plasma activation bonding may be adopted as a joining method.

Figure 22C:
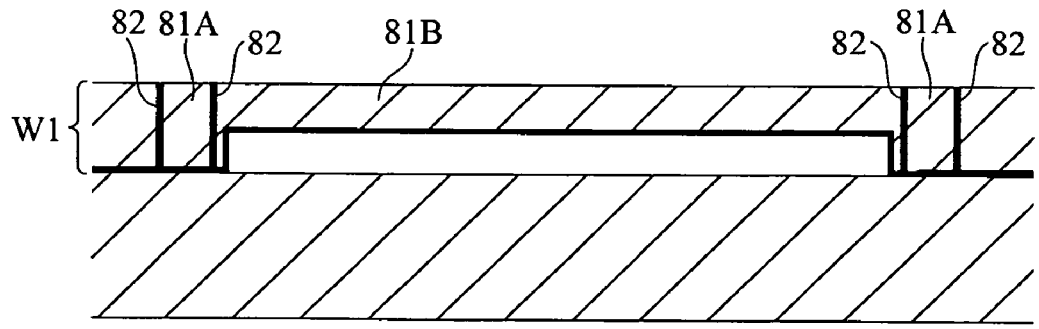

As illustrated in FIG. 22C, the packaging wafer W1 is thinned by, for example, CMP or DRIE. Wiring regions 81A in the packaging wafer W1 are insulated and separated from non-wiring regions 81B by insulating films 82. The thickness of the packaging wafer W1 may be reduced to, for example, 50 to 150 μm.

Figure 22D:
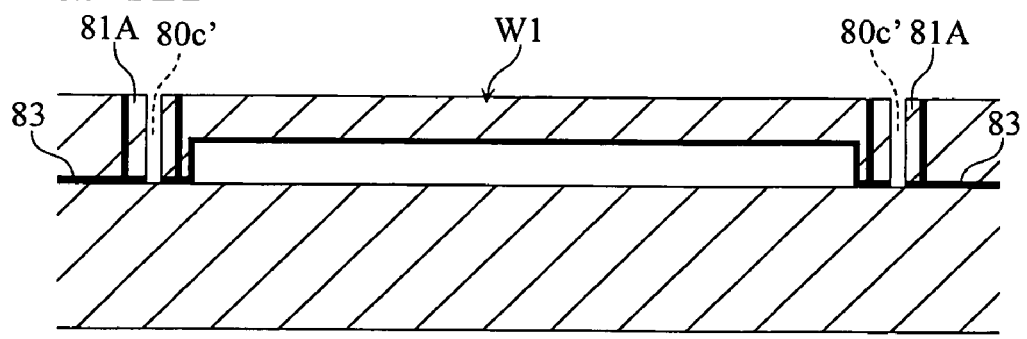

As illustrated in FIG. 22D, through holes 80c' are formed in the packaging wafer W1. To form the through holes 80c', the wiring regions 81A are etched using a resist pattern as a mask until an insulating film 83 is exposed. As an etching method, DRIE is used as an example. Exposed portions of the insulating film 83 are removed by etching. In this way, the through holes 80c' are formed to extend through the packaging wafer W1 via the wiring regions 81a.

Figure 23A:
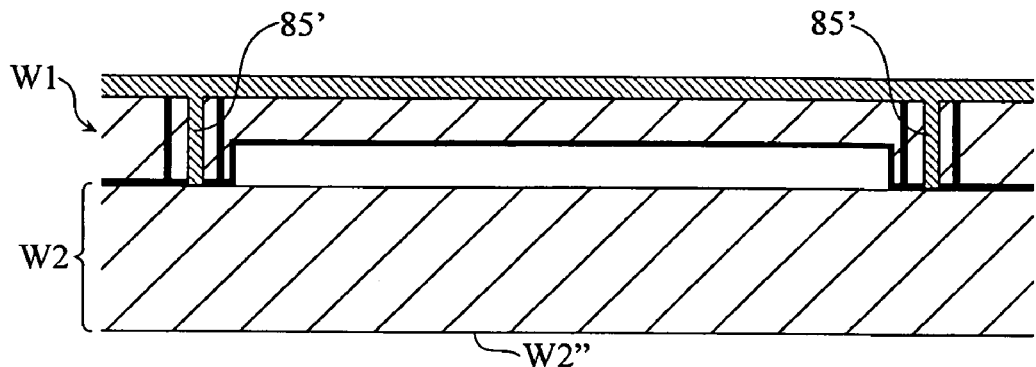
FIGS. 23A to 23D illustrate fabrication processing for the packaged device subsequent to the processing illustrated in FIGS. 22A to 22D.

The through holes 80c' are filled with a conductive material 85' by, for example, LP-CVD or MOCVD, as illustrated in FIG. 23A. The conductive material 85' is also deposited on the packaging wafer W1 outside the through holes 80c'.

Figure 23B:
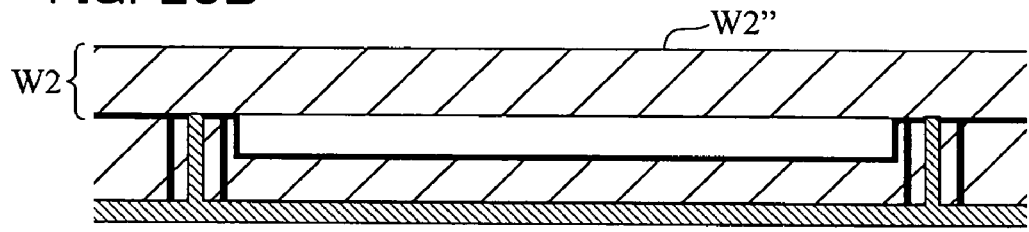

As illustrated in FIG. 23B, the device wafer W2 is thinned. The device wafer W2 may be thinned by being polished from a second surface W2". CMP, for example, may be adopted as a polishing method. The thickness of the device wafer W2 may be reduced to, for example, 20 to 100 μm.

Figure 23C:
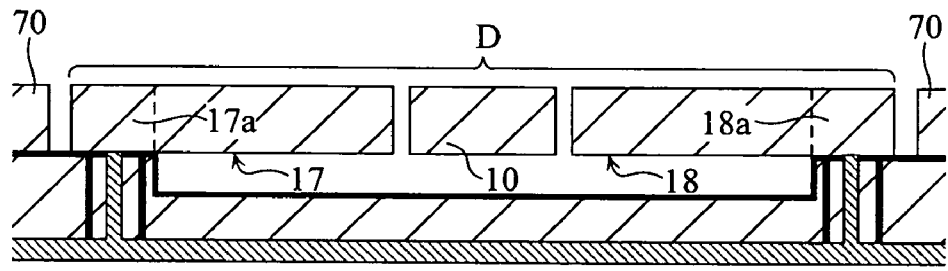

As illustrated in FIG. 23C, in the device wafer W2, sections of the above-described sensing devices D (including vibrating portions 10 and 20, driving electrodes 11 to 14 and 21 to 24, monitor electrodes 15, 16, 25, and 26, detection electrodes 17, 18, 27, and 28, coupling beam 30, anchor portions 40, and connecting portions 50 and 60) and outer wall portions 70 are formed. In this process, for example, the device wafer W2 is etched by DRIE using, as a mask, a resist pattern having a pattern shape corresponding to the sections of the sensing devices D and the outer wall portions 70.

Figure 23D:
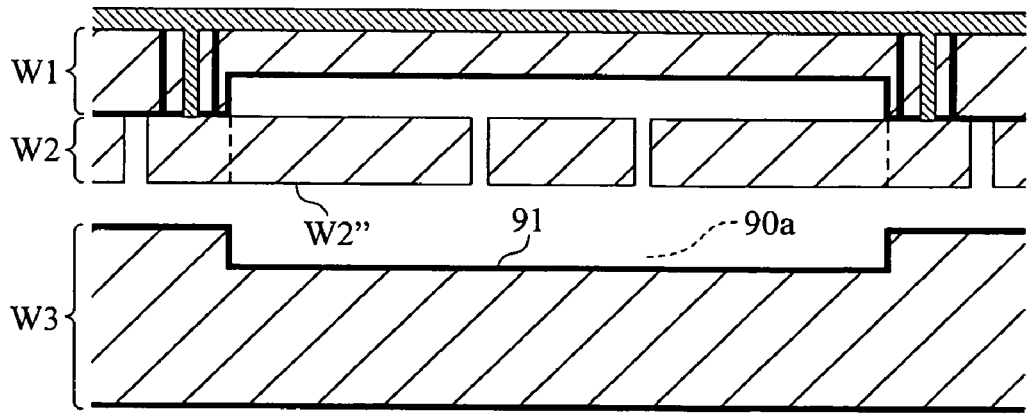
Figure 24A:
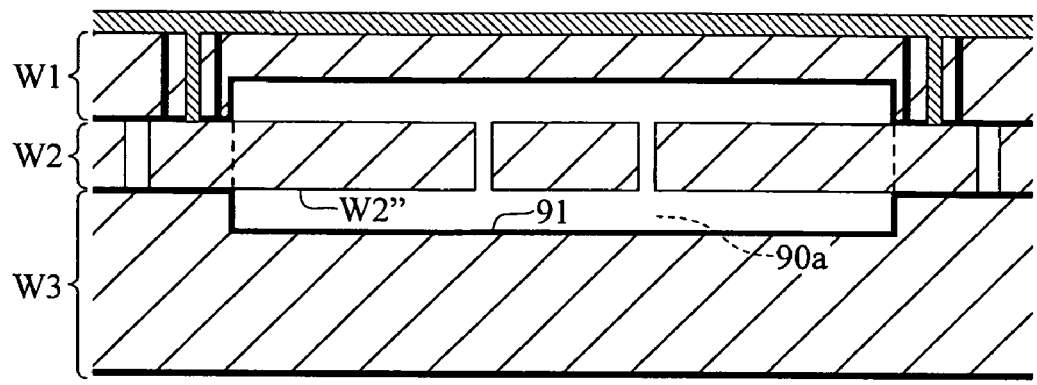
FIGS. 24A to 24C illustrate fabrication processing for the packaged device subsequent to the processing illustrated in FIGS. 23A to 23D.

As illustrated in FIGS. 23D and 24A, the second surface W2" of the device wafer W2 is joined to a packaging wafer W3. The packaging wafer W3 is configured by methods similar to those illustrated in FIGS. 18C and 19A Joining is performed by, for example, room-temperature bonding, direct bonding, or plasma activation bonding. Thus, packaging on the wafer level is attained.

Figure 24B:
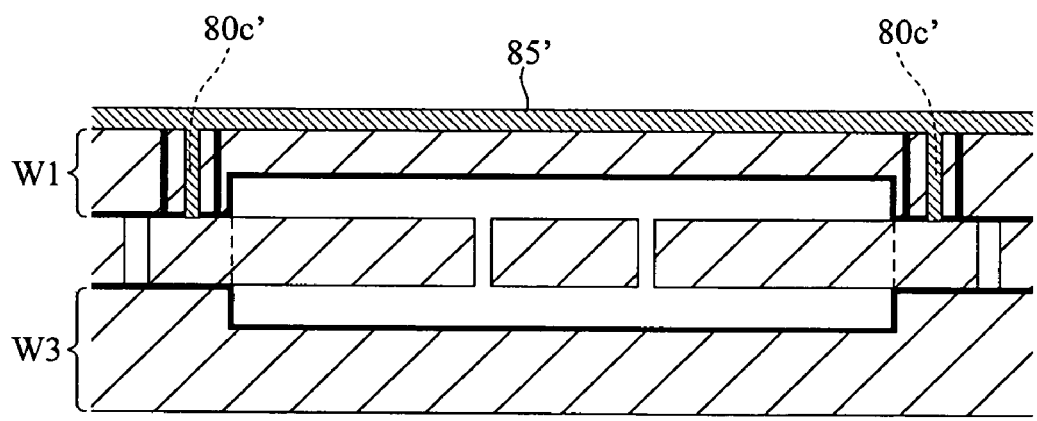

As illustrated in FIG. 24B, for example, the packaging wafer W3 is thinned by CMP or DRIE. The thickness of the packaging wafer W3 may be reduced to, for example, 50 to 200 μm.

Figure 24C:
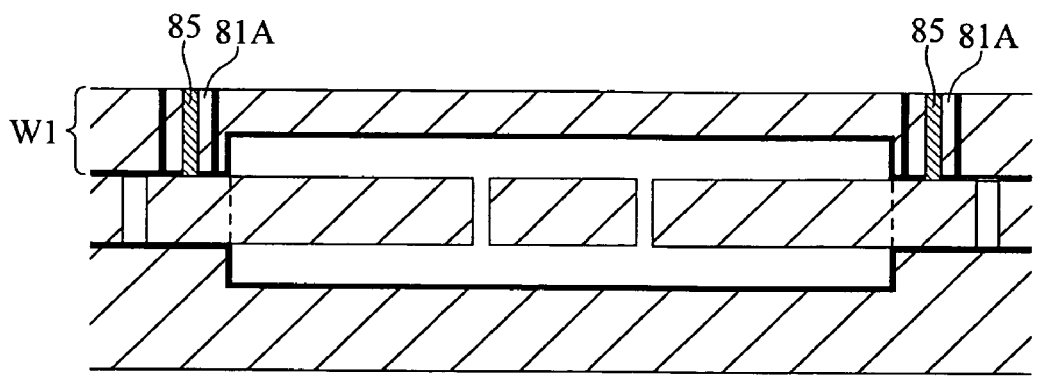

As illustrated in FIG. 24C, the conductive material 85' deposited on the packaging wafer W1 outside the through holes 80c' is removed by, for example, CMP. Conductive plugs 85 are formed to extend through the packaging wafer W1 via wiring regions 81A.

Figure 25A:
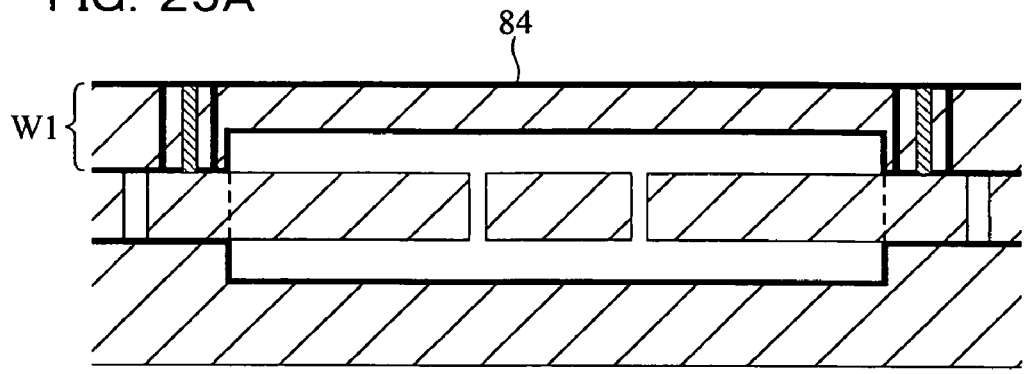
FIGS. 25A to 25C illustrate fabrication processing for the packaged device subsequent to the processing illustrated in FIGS. 24A to 24C.
Figure 25B:
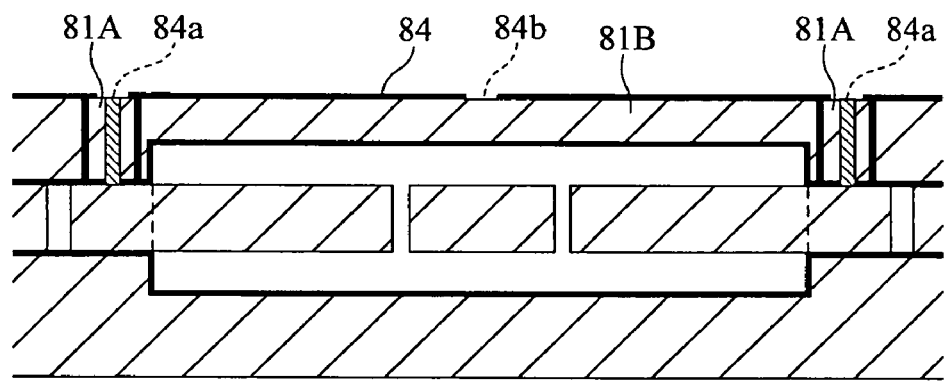
Figure 25C:
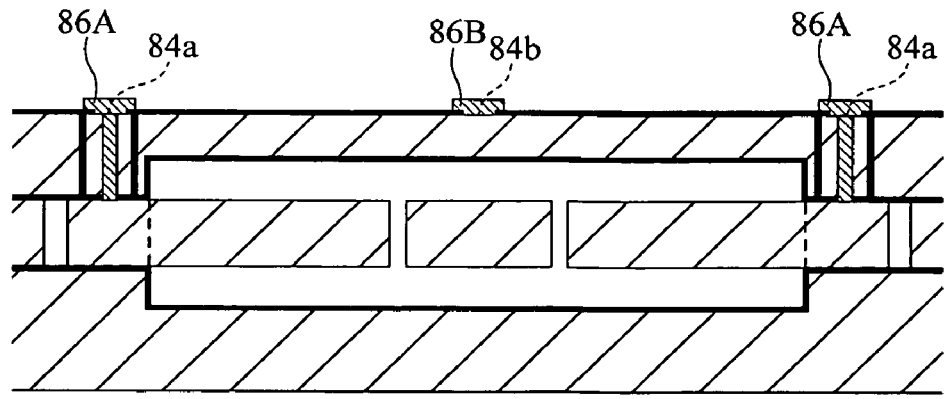

As illustrated in FIG. 25A, an insulating film 84 is formed. Then, openings 84a and 84b are formed in the insulating film 84, as illustrated in FIG. 25B, and electrode pads 86A and 86B are formed, as illustrated in FIG. 25C. Specifically, the processing illustrated in FIGS. 25A to 25C is similar to the processing illustrated in FIGS. 20A to 20C.

Figure 26A:
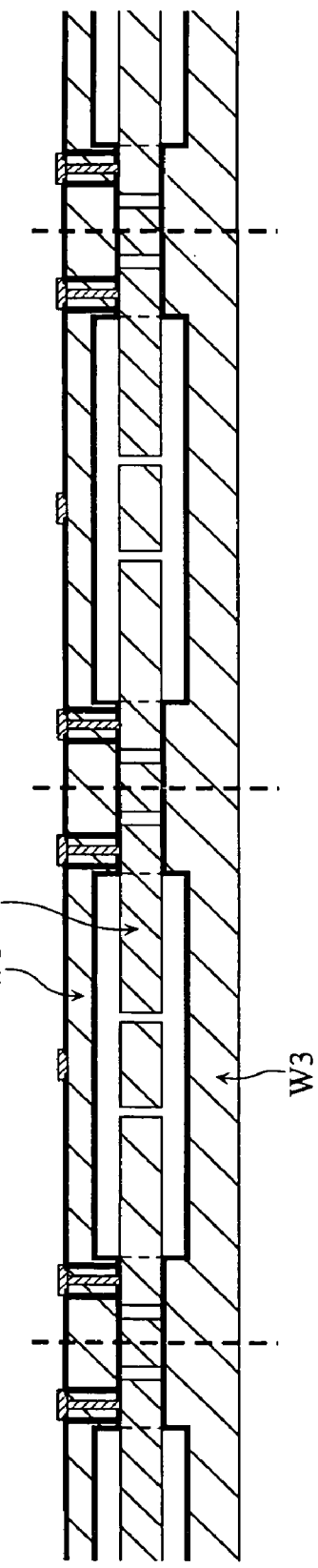
FIGS. 26A and 26B illustrate fabrication processing for the packaged device subsequent to the processing illustrated in FIGS. 25A to 25C.
Figure 26B:
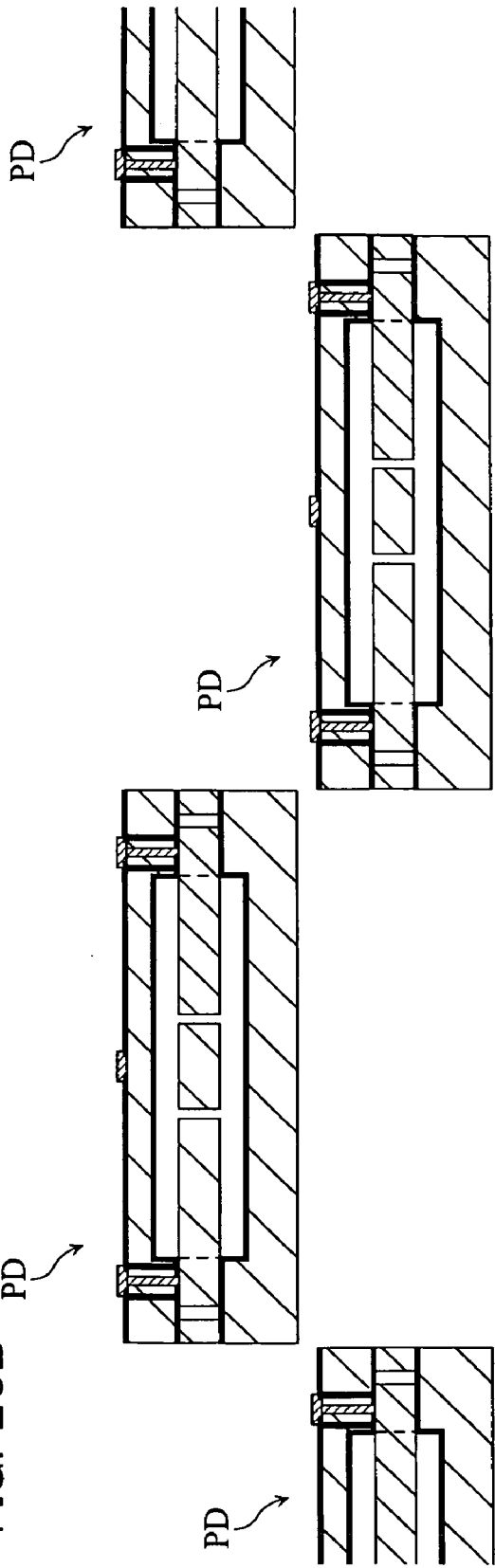

As illustrated in FIGS. 26A and 26B, a laminated structure body including the device wafer W2 and the packaging wafers W1 and W3 is cut. Thus, packaged devices PD according to this embodiment are fabricated.

Since this method allows packaging on the wafer level, it is possible to prevent operation performance of the movable parts from being adversely affected by dust adhesion or damage to the elements of the sensing device D serving as a movable microdevice.

In this method, the packaging wafer W1 includes a plurality of sections for forming the packaging members 80 in the packaged devices PD. The thickness of the packaging wafer W1 illustrated in FIG. 22B is larger than that of the packaging members 80 included in the packaged devices PD. After being joined to the device wafer W2, the packaging wafer W1 is thinned, as illustrated in FIG. 22C. In this case, since the packaging wafer W1 is joined to the device wafer W2, the device wafer W2 does not easily become damaged. The packaging member 80 originates from the packaging wafer W1 thinned in this way. Thus, since this method allows the packaging member 80 to be easily thinned, this method is suited for thinning of the packaged device PD or the package.

As described above, this method is suited for thinning the package, ensuring the strength of the packaging wafer W1 before the packaging wafer W1 is joined to the device wafer W2, and reducing the number of procedures.

Joining of the device wafer W2 and the packaging wafer W3 illustrated in FIGS. 23D and 24A may be performed before joining the packaging wafer W1 and the device wafer W2 illustrated in FIG. 22B. In this case, processing of the device wafer W2 illustrated in FIGS. 23B and 23C is performed between joining the device wafer W2 and the packaging wafer W3 and joining the packaging wafer W1 and the device wafer W2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of fabricating a packaged-device comprising:
    forming grooves in a plurality of first-packaging-member forming regions included in a first packaging wafer so as to form a plurality of wiring regions defined by the grooves;

forming insulating portions in the grooves;

joining a surface of the first packaging wafer on which the wiring regions are formed, to a first surface of a device wafer including a plurality of device forming regions after forming the insulating portions in the grooves;

forming through holes in the wiring regions of the first packaging wafer after joining the first packaging wafer to the device wafer, the through holes extending through the first packaging wafer;

filling the through holes with a conductive material;

joining a second packaging wafer to a second surface of the device wafer opposite the first surface, the second packaging wafer including a plurality of second-packaging-member forming regions;

exposing the wiring regions by thinning the first packaging wafer after joining the first packaging wafer to the device wafer; and forming a plurality of laminated structure bodies including the first-packaging-member forming regions, the device forming regions, and the second-packaging-member forming regions by cutting the device wafer, the first packaging wafer, and the second packaging wafer after thinning the first packaging wafer.

2. The method according to claim 1, wherein the first packaging wafer is thinned after filling the through holes with the conductive material or before forming the through holes in the first packaging wafer.

3. The method according to claim 1, further comprising:
thinning the second packaging wafer after joining the second packaging wafer to the device wafer.

4. The method according to claim 1,
wherein the second packaging wafer is joined to the device wafer after joining the first packaging wafer to the device wafer, and
wherein the method further comprises:
forming movable microdevices in the device wafer after joining the first packaging wafer to the device wafer and before joining the second packaging wafer to the device wafer.

5. The method according to claim 1,
wherein the second packaging wafer is joined to the device wafer before joining the first packaging wafer to the device wafer, and
wherein the method further comprises:
forming movable microdevices in the device wafer after joining the second packaging wafer to the device wafer and before joining the first packaging wafer to the device wafer.

6. The method according to claim 1, further comprising:
forming an insulating film on a surface of the first packaging wafer;
forming openings in the insulating film; and
forming electrode pads at the openings,
wherein the insulating film, the openings, and the electrode pads are formed after filling the through holes with the conductive material, after thinning the first packaging wafer, and before cutting the device wafer, the first packaging wafer, and the second packaging wafer.

7. The method according to claim 6, wherein the electrode pads are provided in the openings in an in-plane direction of the first packaging member.

8. The method according to claim 1, further comprising:
forming recesses in the first-packaging-member forming regions of the first packaging wafer before joining the first packaging wafer to the device wafer, the recesses to be facing the device forming regions of the device wafer.

9. The method according to claim 1, further comprising:
forming recesses in the second-packaging-member forming regions of the second packaging wafer before joining the second packaging wafer to the device wafer, the recesses to be facing the device forming regions of the device wafer.

* * * * *